(12) United States Patent
Maruyama et al.

(10) Patent No.: US 7,921,906 B2
(45) Date of Patent: Apr. 12, 2011

(54) TEMPERATURE CONTROL METHOD AND TEMPERATURE CONTROL DEVICE

(75) Inventors: Shigeyuki Maruyama, Kawasaki (JP); Hiroshi Misawa, Kawasaki (JP); Naohito Kohashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 871 days.

(21) Appl. No.: 11/350,894

(22) Filed: Feb. 10, 2006

(65) Prior Publication Data
US 2006/0245161 A1    Nov. 2, 2006

(30) Foreign Application Priority Data
Apr. 28, 2005  (JP) .................. 2005-132550

(51) Int. Cl.
*F25D 21/14*    (2006.01)
(52) U.S. Cl. .............. 165/287; 165/253; 165/48.1
(58) Field of Classification Search .......... 165/253, 165/287, 47, 48.1, 58, 61
See application file for complete search history.

(56) References Cited

U.S. PATENT DOCUMENTS

| 4,253,515 A | * | 3/1981 | Swiatosz | ............... 165/61 |
| 4,848,090 A | * | 7/1989 | Peters | ............... 165/253 |

FOREIGN PATENT DOCUMENTS

| JP | 61-269085 | 11/1986 |
| JP | 63-91577 | 4/1988 |
| JP | 8-186205 | 7/1996 |
| JP | 9-329394 | 12/1997 |
| JP | 3069072 | 3/2000 |
| JP | 2001-526837 | 12/2001 |
| WO | 98/46059 | 10/1998 |

OTHER PUBLICATIONS

Page, John. "Math Open Reference: Trapezoid (USA Definition)", 2008. [retrieved on Aug. 9, 2009]. Retrieved from the Internet: <URL: http://www.mathopenreference.com/trapezoid.html>.*
"Trapezoids". [retrieved on Aug. 9, 2009]. Retrieved from the Internet: <URL: http://www.math.washington.edu/~king/coursedir/m444a00/syl/class/trapezoids/Trapezoids.html>.*

* cited by examiner

*Primary Examiner* — Ljiljana (Lil) V Ciric
(74) *Attorney, Agent, or Firm* — Westerman, Hattori, Daniels & Adrian, LLP

(57) ABSTRACT

In a temperature control method, a controlled part is arranged to contact a first principal surface of a heat conduction part. The heat conduction part has the first principal surface and a second principal surface opposite to the first principal surface. The first principal surface has a configuration corresponding to a configuration of the controlled part. The second principal surface is larger in surface area than the first principal surface. At least one of a heating unit and a cooling unit is driven to set the controlled part at a predetermined temperature. The heating unit and the cooling unit are disposed on the second principal surface of the heat conduction part so that the heating unit and the cooling unit are arranged side by side.

4 Claims, 17 Drawing Sheets

TEMPERATURE CONTROL METHOD AND TEMPERATURE CONTROL DEVICE

CROSS-REFERENCE TO RELATED APPLICATIONS

This application is based upon and claims the benefit of priority of Japanese Patent Application No. 2005-132550, filed on Apr. 28, 2005, the entire contents of which are herein incorporated by reference.

BACKGROUND OF THE INVENTION

1. Field of the Invention

The present invention generally relates to a temperature control method and a temperature control device for use in the temperature control method. In particular, the present invention relates to a temperature control method in which a controlled part, such as an electronic part, is subjected to heating or cooling so that the controlled part is set at a given temperature different from a normal temperature, in order to carry out evaluation and/or testing of the controlled part.

2. Description of the Related Art

In the following, the electronic parts are semiconductor integrated circuit devices, such as IC and LSI, which will be referred to as semiconductor devices.

While the electronic parts are required to attain high integration and advanced features, the environment and conditions in which they are used have become severe. There is the increasing demand for higher reliability of the electronic parts, including the temperature characteristics thereof.

The improvement of the MPU (micro processing unit) for high-end servers, among various semiconductor devices, in the speed and the parallel processing of plural arithmetic computations is advancing quickly. As a result, the increase of the electric power which is consumed by a single semiconductor device (semiconductor chip), i.e., the raise of the power consumption, is progressing.

Although the power consumption of a conventional MPU was in a range of 10 watts to 30 watts, the power consumption of the current MPU is now in a range of 100 watts to 200 watts. It is readily expected that the power consumption of a MPU in the near future will exceed 300 watts.

The operation of a semiconductor device causes a temperature rise due to the self-heating and the surrounding environment, and the operation of the semiconductor device becomes unstable. The above-mentioned temperature rise is fundamentally proportional to the power consumption of that semiconductor device.

For this reason, when conducting the performance test of a semiconductor device etc., it is indispensable to control the temperature of a semiconductor device to a desired temperature at the time of operation.

In order to realize the high integration and advanced features of semiconductor devices, the miniaturization and high-density structure of the functional devices, such as transistors, the wiring, etc., are attempted, and the calorific value per unit area (heat density) tends to increase.

For this reason, when conducting the performance test of semiconductor devices, high cooling efficiency is needed and advanced technology of temperature control is demanded.

The power consumption of a semiconductor device greatly varies depending on the kind of the semiconductor device (the difference of functions, capacity, etc.). Namely, the temperature rise due to the self-heating varies for every semiconductor device.

For this reason, in order to control the temperature of a semiconductor device to a desired value at the time of operation, it is necessary to change the cooling temperature according to the electric power which is consumed by the semiconductor device of concern.

Unless the cooling temperature is selected, the difference of the power consumption appears as a difference of the temperature (junction temperature Tj) of the semiconductor device of concern, and exact operation of the semiconductor device cannot be checked and compensated.

Therefore, the checking and compensating of the operating characteristics cannot be performed to various kinds of semiconductor devices with which the heat generating characteristics differ under the controlled temperature condition or at a constant low temperature.

As for the semiconductor device with which high integration and advanced features thereof are implemented, the power consumption greatly varies with the states of operation (the contents of operation) at the time of operation as mentioned above.

Also when conducting the testing for checking and compensating the operating characteristic of a semiconductor device, the power consumption, i.e., the temperature of a semiconductor device, will change with the respective testing items sharply. For this reason, it is necessary to control the temperature of a semiconductor device in accordance with the state of operation and the testing item of the semiconductor device.

The relation between the cooling temperature of the semiconductor device surface and the temperature of the semiconductor device itself is represented by the formula:

$$Tj = Tc + P \times Rjc$$

where "Tj" denotes the temperature of the semiconductor device itself, "Tc" denotes the surface temperature of the cooled portion (the surface of the semiconductor chip itself, the surface of the package accommodating a semiconductor chip, etc.) of the semiconductor device, "P" denotes the power consumption of the semiconductor device at the time of operation (in W), and "Rjc" denotes the thermal resistance between the semiconductor device itself and the cooling portion (in degrees C/W).

Conventionally, in order to examine and evaluate the temperature characteristics of a semiconductor device, the cooling processing or heat-treatment is given to the semiconductor device of concern in the manufacture process, and evaluating and examining the operating characteristics in the respective states is conducted.

In order to carry out the above-mentioned heat-treatment and cooling processing, the cooling element, such as a heat conductive material provided with radiation fins, or the heater element, such as a heater, is contacted to the package accommodating the evaluated/tested semiconductor device. These elements are used so that the semiconductor device under the evaluation/testing is cooled or heated to a desired temperature, and the temperature characteristics of the semiconductor device are evaluated.

Several conventional systems for examining and evaluating the operating characteristics of the semiconductor device in the respective states by giving the cooling processing or heat treatment to the evaluated/tested semiconductor device are known. For example, see Japanese Laid-Open Patent Application No. 61-269085, Japanese Laid-Open Patent Application No. 63-091577, and Japanese Laid-Open Patent Application No. 2001-526837.

Japanese Laid-Open Patent Application No. 61-269085 discloses a temperature test system using a plate-like heating-medium part, having outside dimensions equivalent to those of the electronic part, in which the temperature sensor is embedded. In the temperature test system, the thermoelectric effect element, such as a Peltier device (Peltier effect element), and the resistance heating element are arranged in a staggered formation on one principal surface of the heating medium part.

The heating medium part is made of a thermally conductive material, such as aluminum (Al). And in the state where the other principal surface of the heating medium part is contacted to the examined/evaluated electronic part, the thermoelectric effect element is operated (the resistance heating element is also operated if needed), the cooling or heating is performed, so that the temperature characteristics of the electronic part are evaluated.

In the above-mentioned composition, the thermoelectric effect element and the resistance heating element are arranged in a staggered formation on the principal surface of the heating medium part which has an area equivalent to the contact surface of the electronic part evaluated or tested.

According to the above composition, the heating medium part has the area equivalent to the area of the electronic part of concern, and the heating medium part has a thickness equivalent to that of the electronic part. The heat capacity of the heating medium part is comparatively small, and the rapid temperature change in the electronic part cannot be absorbed or diffused. And the electronic part is subjected to the rapid cooling by the thermoelectric effect element, and a thermal damage will be given to the electronic part.

Japanese Laid-Open Patent Application No. 63-091577 discloses a cooling and heating device in which the Peltier device and the radiation fin are arranged with a spacer interposed between them on one principal surface of a contact plate in which the temperature sensor is embedded.

And in the state where the other principal surface of the contact plate is contacted to the examined/evaluated semiconductor device, the Peltier device is operated so that the heating or the cooling is performed, and the temperature characteristics of the semiconductor device are evaluated.

In the above-mentioned composition, to the semiconductor device being examined, two or more Peltier devices are laminated on one principal surface of the contact plate. Also there is the composition in which the radiation fin is arranged further.

According to the above composition, the heat dissipation is processed through the contact plate, the Peltier device, the spacer and the radiation fin in this order when cooling the semiconductor device. The passage of the heat conduction is comparatively long, the heat capacity is comparatively large, and it is difficult to achieve rapid cooling or rapid heating of the semiconductor device.

Moreover, Japanese Laid-Open Patent Application No. 2001-526837 discloses a temperature control system in which the heat sink is disposed on one principal surface of the electric heater. And in the state where the other principal surface of the electric heater is directly contacted to the examined/evaluated electronic device (the semiconductor device with the built-in temperature sensor), the electric heater is operated so that the heating is performed and the heat is radiated by using the heat sink, so that the temperature characteristics of the electronic device are evaluated. In the above-mentioned composition, the heat sink is allocated via the electric heater to the electronic device being examined.

According to the above composition, there is no unit for cooling directly the semiconductor device (the evaluated/tested electronic device) to a lower temperature, and it is difficult to conduct the above-mentioned evaluation or testing of the semiconductor device in such a cold condition.

Moreover, the electric heater is interposed between the heat sink and the semiconductor device (the evaluated/tested electronic device), and the heat produced from the evaluated/tested electronic device is dissipated through a high thermal resistance region. The heat conduction passage is long, and the heat capacity is comparatively large, and it is difficult to carry out prompt cooling or heating of the semiconductor device.

SUMMARY OF THE INVENTION

An object of the present invention is to provide an improved in which the above-mentioned problems are eliminated.

Another object of the present invention is to provide a temperature control method and device which carries out prompt cooling or heating of an electronic part, such as a semiconductor device, without causing the thermal stress.

In order to achieve the above-mentioned objects, the present invention provides a temperature control method comprising the steps of: arranging a controlled part to contact a first principal surface of a heat conduction part, the heat conduction part having the first principal surface and a second principal surface opposite to the first principal surface, the first principal surface having a configuration corresponding to a configuration of the controlled part, the second principal surface having an area larger than an area of the first principal surface; and driving at least one of a heating unit and a cooling unit to set the controlled part at a predetermined temperature, the heating unit and the cooling unit being disposed on the second principal surface of the heat conduction part so that the heating unit and the cooling unit are arranged side by side.

In order to achieve the above-mentioned objects, the present invention provides a temperature control device comprising: a heat conduction part having a first principal surface contacting a controlled part, and a second principal surface opposite to the first principal surface; a heating unit disposed on the second principal surface of the heat conduction part; and a cooling unit disposed on the second principal surface of the heat conduction part so that the heating unit and the cooling unit are arranged side by side, wherein the first principal surface of the heat conduction part has a configuration corresponding to a configuration of the controlled part, and the second principal surface has an area larger than an area of the first principal surface.

According to the temperature control method and device of the present invention, the heat conduction part having the first and second principal surfaces is used, the first principal surface having a configuration corresponding to that of the controlled part, such as the electronic part, and the second principal surface having an area larger than that of the first principal surface, and the heating unit and the cooling unit are disposed on the second principal surface of the heat conduction part. The heat produced from the controlled part is effectively absorbed by the heat conduction part, so that the heat is spread and equalized. The heating and cooling of the controlled part is performed by the heating unit and the cooling unit. Even for the controlled part with a large calorific value, or the controlled part with a large consumption power to treat, the temperature control can be carried out quickly in response to a change of the consumption power of the controlled part.

Accordingly, even when the controlled part has a large consumption power, the evaluation and/or testing of the temperature characteristics can be efficiently carried out with high accuracy.

When the heating unit and the cooling unit are operated simultaneously in order to set the temperature of the controlled part at a predetermined temperature, the difference of temperature of the controlled part produced in such a case under the heating unit and the cooling unit is conducted horizontally and equalized within the heat conduction part, and it is directed to the controlled part on the first principal surface. Thereby, the temperature of the controlled part can be controlled with good accuracy and promptness.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the preferred embodiments of the present invention with reference to the accompanying drawings.

First Embodiment

The first embodiment of the temperature control device according to the invention will be explained using FIG. 1A and FIG. 1B.

Figure 1A:
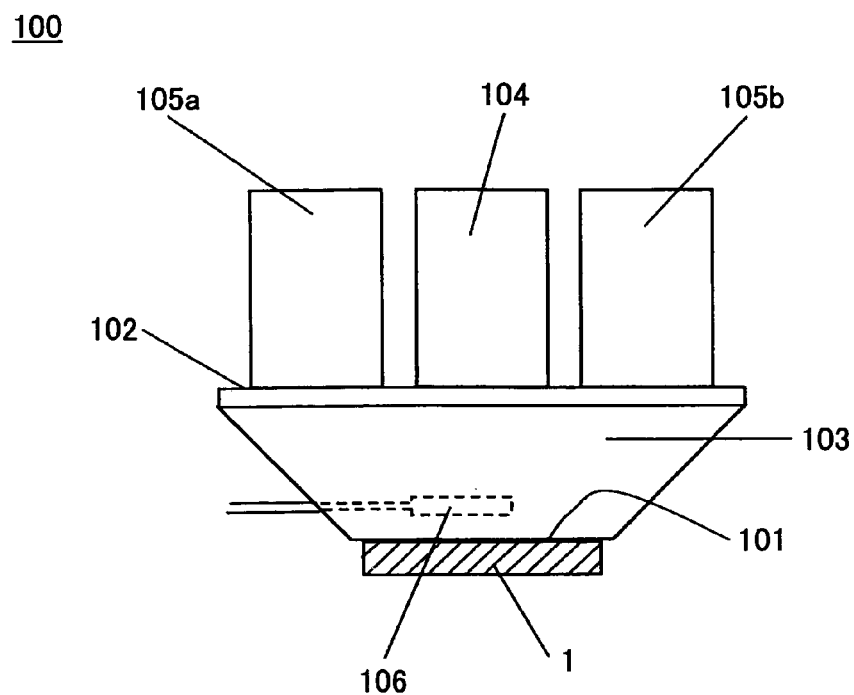
FIG. 1A is a side view showing the first embodiment of the temperature control device according to the invention.
Figure 1B:
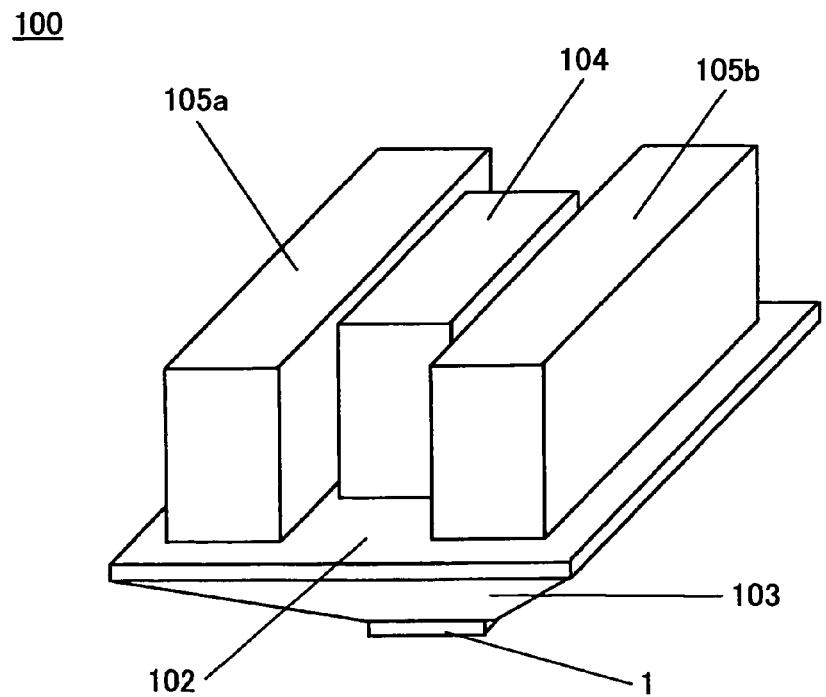
FIG. 1B is a perspective view showing the first embodiment of the temperature control device according to the invention.

As shown in FIG. 1A and FIG. 1B, the temperature control device 100 in this embodiment comprises the heat conduction part 103 having the first principal surface 101 and the second principal surface 102, the heating unit 104, and the cooling units 105*a* and 105*b*. The first principal surface 101 can be contacted to the electronic part 1 which is the object of temperature control, such as a semiconductor device. The second principal surface 102 is opposite to the first principal surface 101.

The heating unit 104 is disposed almost in the central part on the second principal surface 102, and the cooling units 105*a* and 105*b* are disposed on the second principal surface 10 so that the heating unit 104 and the cooling units 105*a* and 105*b* are arranged side by side.

In the above-mentioned composition, the electronic part 1 (which is the controlled part) is, for example, a semiconductor integrated circuit device. The package configuration of the electronic part 1 is not specified, and it may be any of a resin-molded semiconductor device, a metal/ceramic sealing-type semiconductor device, or a bulk-shaped semiconductor device. In addition, the external connection structure is not specified, and it may be any of a plate-like lead formation, a ball grid array (BGA), a land grid array (LGA), etc.

For this reason, in the following embodiments, the external connection terminals are disposed on the surface which does not touch the first principal surface 101 of the heat conduction part 103 although the outside configuration is not illustrated specifically. And at the time of evaluation and testing of the electronic part, the external connection terminals of the electronic part are electrically connected to the terminal area of the evaluation/testing board. However, in the following embodiments, the above-mentioned states are not described specifically and not illustrated.

The heat conduction part 103 is made of a thermally conductive material, such as copper (Cu) or aluminum (Al). The first principal surface 101 of the heat conduction part 103 has the configuration and area corresponding to the configuration and area of the electronic part 1. The second principal surface 102 has the area larger than the area of the first principal surface 101. The first principal surface 101 and the second principal surface 102 are separate from each other with a certain distance, and they are made substantially in parallel.

And the side of the heat conduction part 103 is configured in a tapered formation straightly extending from the end of the first principal surface 101 to the end of the second principal surface 102. Therefore, the heat conduction part 103 has a generally trapezoidal cross-section.

In the heat conduction part 103, the configuration and area of the first principal surface 101 are made to correspond to the configuration and area of the electronic part concerned. If the electronic part is a semiconductor integrated circuit element, it is configured in the shape of a rectangle. The area of the first principal surface 101 is in the range between 30 mm×30 mm and 50 mm×50 mm. The area of the second principal surface 102 is in the range between 60 mm×60 mm and 100 mm×100×mm.

However, the configuration is not restricted to a rectangular shape, and it may be a circular shape. The thickness of the heat conduction part 103 is in the range between 30 mm and 50 mm.

By making the circumference of the first principal surface 101 of the heat conduction part 103 into the tapered shape, spreading of the conduction path of heat within the heat conduction part 103 is prevented, and the temperature control characteristic is increased.

The temperature sensor 106 is disposed in the inside of the heat conduction part 103 (embedded) near the first principal surface 101, or in the vicinity of the electronic part 1 which is the object of the temperature control.

On the other hand, the heating unit 104 comprises an electric resistance heater. The cooling unit 105 comprises a cooling block or a Peltier device with radiating fins contacting the Peltier device. In the cooling unit 105, the cooling media, such as water, alternative chlorofluocarbon, or liquid nitrogen, may come in contact with the cooling block or the radiation fins. Such configuration is not illustrated.

Moreover, the illustration of the lead wires drawn from the electric resistance heater 104 and the Peltier device, and of the circulation path of the cooling medium will be omitted.

In temperature control device 100 having the above-mentioned composition, when the temperature of the electronic part 1 rises due to heat generated in the electronic part 1, the temperature sensor 106 detects such temperature change. The cooling unit 105 is controlled to operate based on the detection result. As a result, the heat generated from the electronic part conducts the heat conduction part 103, and it is absorbed and radiated by the cooling unit 105, and the temperature rise of the electronic part 1 is prevented.

At this time, the heat conduction part 103 which has a larger heat capacity is interposed between the electronic part 1 and the cooling unit 105. For this reason, the heat produced in the electronic part 1 is easily absorbed and radiated by the heat conduction part 103.

And the heat conduction part 103 has a tapered cross-section, the distance between the electronic part 1 and the cooling unit 105 is substantially larger than the thickness (board thickness) of the heat conduction part 103. Therefore, a rapid temperature fall of the electronic part 1 is not invited, and it is possible to prevent giving of a thermal damage to the electronic part 1.

In the heat conduction part 103, the side 103A between the first principal surface 101 and the second principal surface 102 has a tapered shape, and the surface area thereof is comparatively large. Therefore, a thermal insulation layer is disposed on the surface of the side 103A. Alternatively, a heat reflecting member having a surface confronting the side 103A and being substantially parallel to the side 103A may be disposed in the vicinity of the surface of the side 103A. These elements are not illustrated. Of course, it is also possible to provide both the elements together.

The thermal insulation layer may be made of any of an urethane foam, a silicone rubber, a glass epoxy resin, or a baked material, and the heat reflecting member may be made from a mirror or a metal material with a high reflection factor in which the surface of the metal material is subjected to the specular surface processing.

By disposing the heat insulating layer and/or the heat reflecting member as mentioned above, the heat dissipation from the heat conduction part 103 is controlled and prevented, and absorption and conduction of the heat by the heat conduction part 103 are performed with high efficiency.

The arrangement of the heat insulating layer and/or the heat reflecting member is applicable not only to this embodiment but also to the subsequent embodiments described below.

Figure 2:
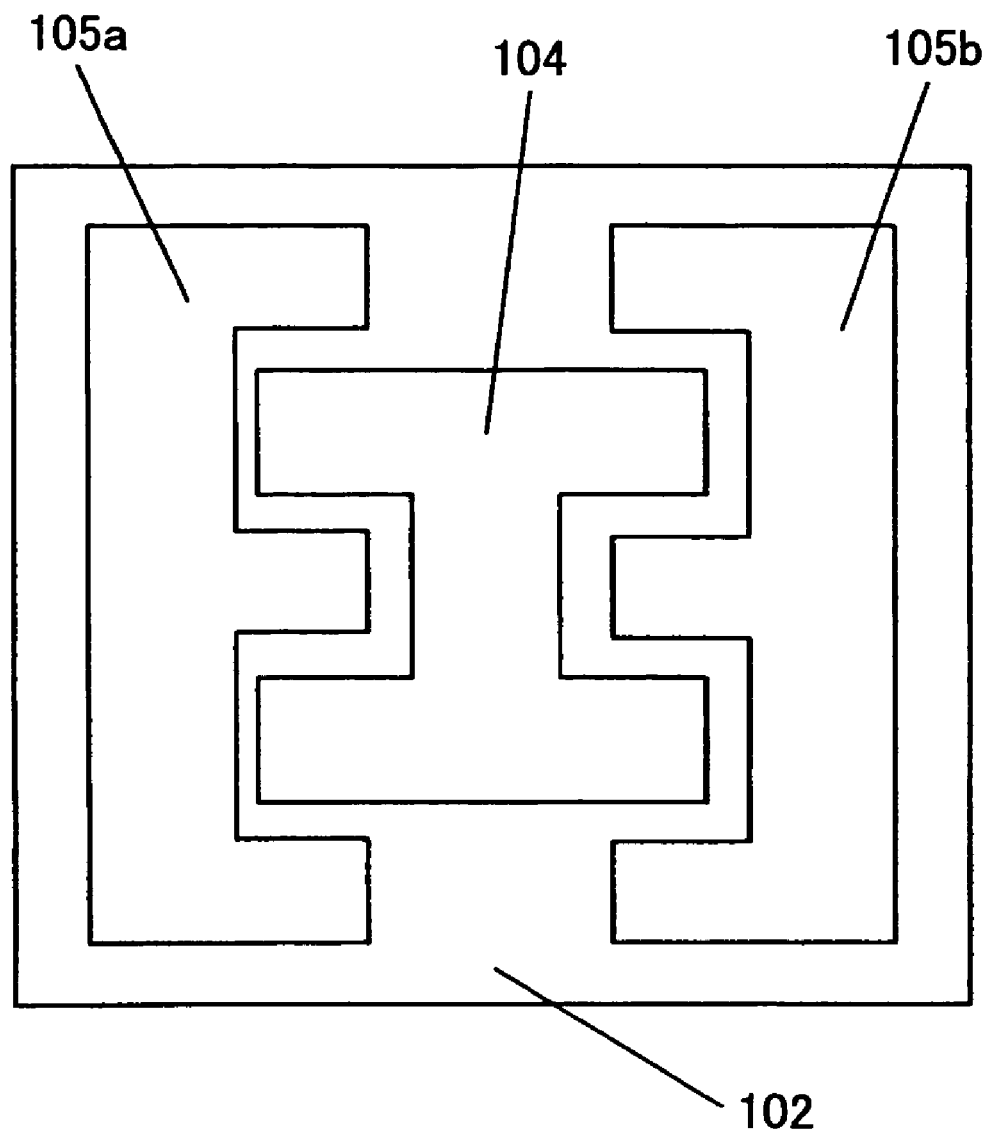
FIG. 2 is a plan view showing the modification of the first embodiment of the temperature control device according to the invention.

On the other hand, the arrangement of the heating unit 104 and the cooling unit 105 on the second principal surface 102 of the heat conduction part 103 is not limited to the mutually parallel configuration as in the present embodiment. Alternatively, it may have an appropriate configuration such as the shape of comb teeth, like the modification A shown in FIG. 2. According to this structure, the heat delivered to and received from the heat conduction part 103 can be made equal.

In order to set the temperature of the electronic part (the controlled part) at a predetermined temperature, the heating unit 104 and the cooling unit 105 are operated simultaneously. In such a case, the difference of temperature is produced between the portions directly under the heating unit 104 and the cooling unit 105. The heat conducts horizontally and it is equalized within the heat conduction part 103. And it is concentrated to the electronic part 1 on the first principal surface 101. Thereby, the temperature of the electronic part 1 can be controlled with good accuracy and promptness.

Figure 3A:
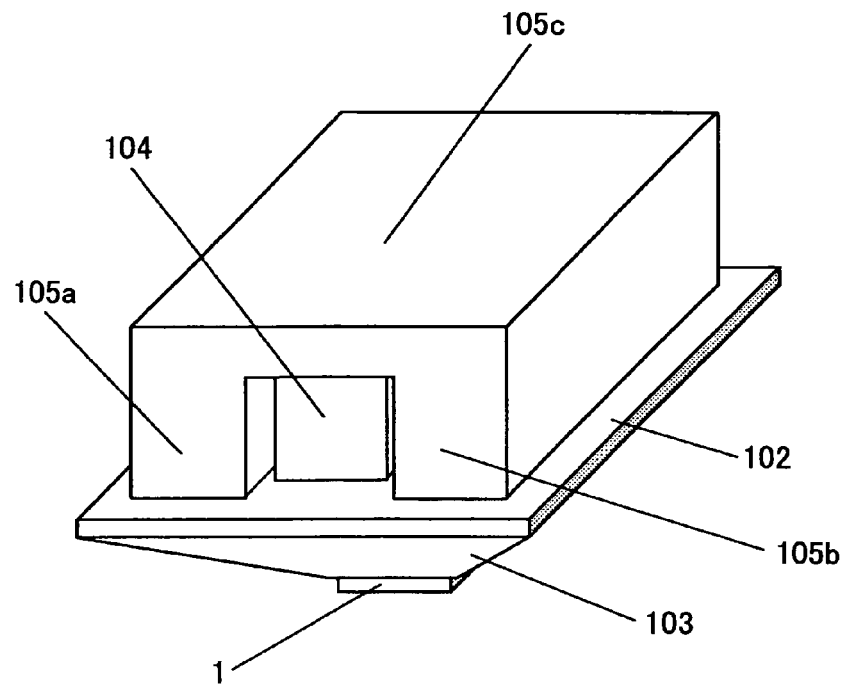
FIG. 3A is a perspective view showing the modification of the first embodiment of the temperature control device according to the invention.
Figure 3B:
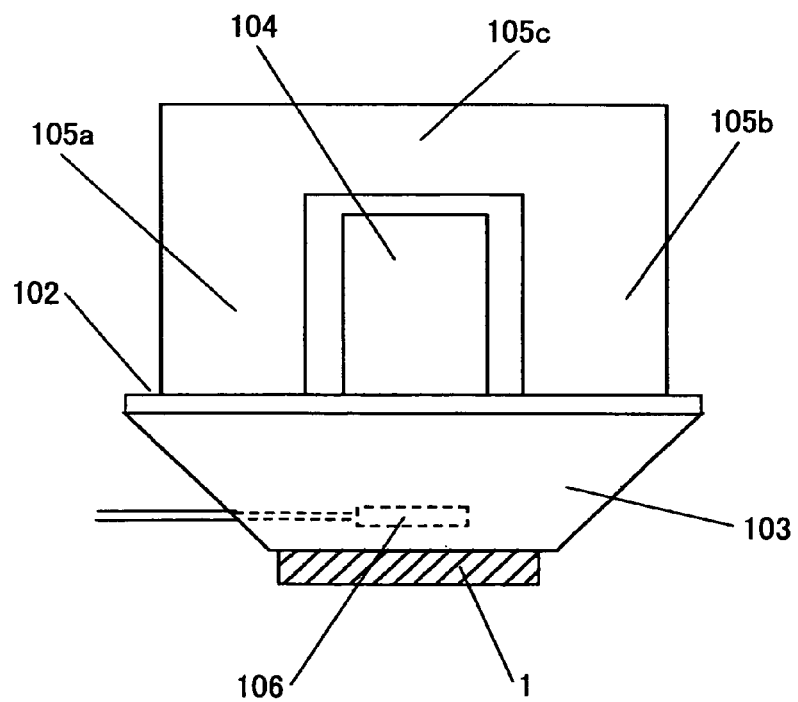
FIG. 3B is a side view showing the modification of the first embodiment of the temperature control device according to the invention.

In the modification B shown in FIG. 3A and FIG. 3B, the cooling units 105a and 105b on the second principal surface 102 are interconnected by the communicating part 105c which is disposed to range over the top of the heating unit 104. According to this structure, the cooling medium which flows through the inside of the cooling unit 105a and 105b can be communalized, and the piping for circulation of the cooling medium can be simplified.

Figure 4A:
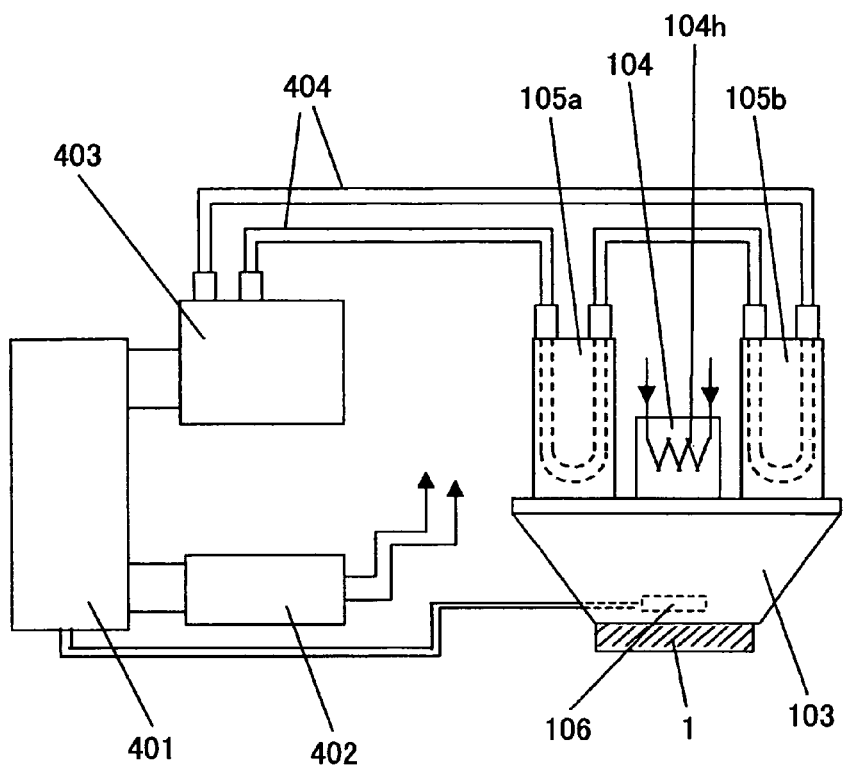
FIG. 4A is a diagram showing the composition of the temperature control system in the first embodiment of the temperature control device according to the invention.
Figure 4B:
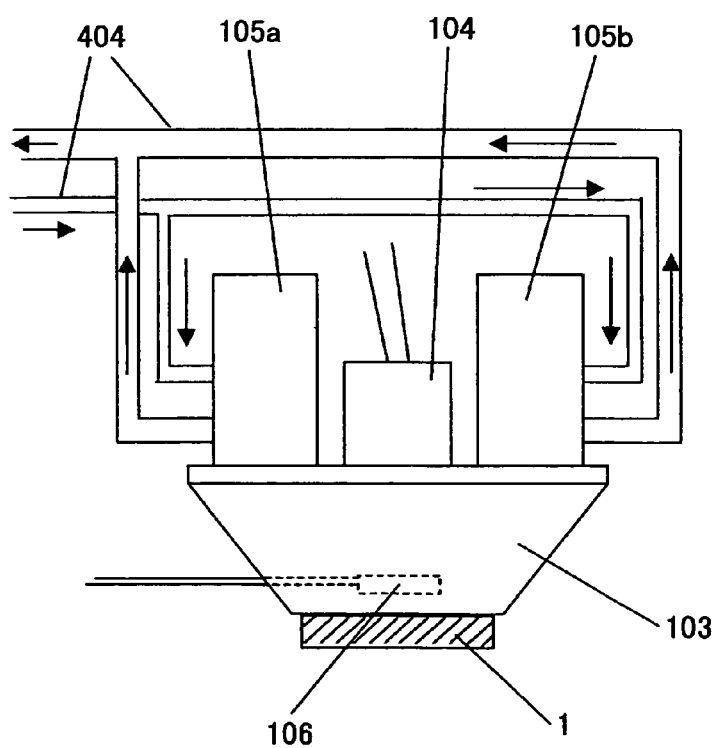
FIG. 4B is a diagram showing the composition of the temperature control system in the first embodiment of the temperature control device according to the invention.
Figure 4C:
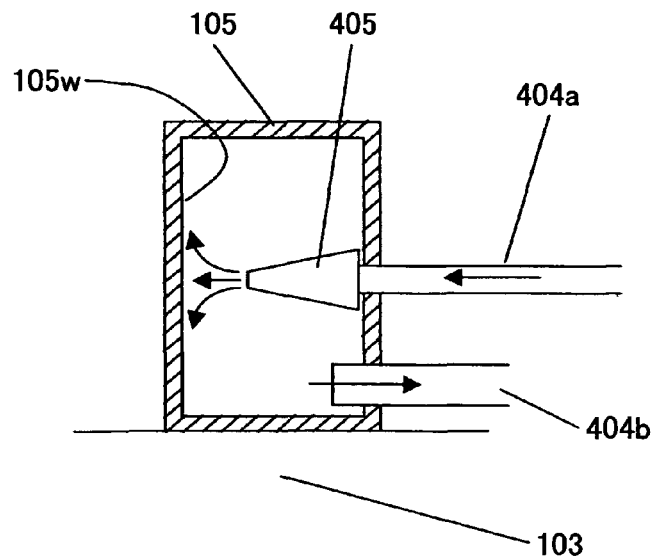
FIG. 4C is a cross-sectional view showing an example of the cooling method in the first embodiment of the temperature control device according to the invention.

FIG. 4A through FIG. 4C show the connection composition, such as the heat source and the system control device for the temperature control device 100 of FIG. 1A.

In FIG. 4A through FIG. 4C, the reference numeral 401 denotes the system control device, 402 denotes the heating control device, and 403 denotes the cooling control device.

The heating control device 402 controls the supply of power and controls the current supplied to the heater 104h disposed in the heating head 104 etc. The cooling control device 403 performs delivery and recovery of the cooling medium, such as water, to the cooling units 105a and 105b.

In the composition of the cooling unit 105 of FIG. 4A, the pipes 404 are disposed so that the cooling unit 105a and the cooling unit 105b are connected in series, and the cooling medium, such as a refrigerant, flows in the pipes 404. That is, the temperature control device of this embodiment employs a cooling system in which the refrigerant flows.

In the above-mentioned composition, in response to the temperature detected by the temperature sensor 106, the system control device 401 controls the heating control device 402 and/or the cooling control device 403, so that the temperature of the electronic part 1 is set at a predetermined value.

In the composition of FIG. 4A, the supply and recovery of the cooling medium to the cooling units 105a and 105b may be carried out as shown in FIG. 4B. Namely, the supply and recovery of the cooling medium may be performed to the cooling unit 105a and the cooling unit 105b in a separate manner. The cooling units 105a and 105b are arranged in a parallel formation, and the cooling medium is supplied and collected respectively.

When supplying the cooling medium separately to each of the cooling units 105a and 105b, the circulation of the cooling medium shown in FIG. 4B may be altered such that the cooling medium is injected to the internal wall of the cooling unit 105 of concern and the cooling is performed.

The above-mentioned composition of the cooling unit 105 is shown in FIG. 4C. As shown in FIG. 4C, the cooling medium supplied through the pipe 404a is injected toward the internal wall 105w of the cooling unit 105 via the nozzle 405, and the cooling medium is contacted to the hot internal wall 105w so that it is evaporated.

The cooling unit 105 is cooled by the evaporation heat at this time. The vaporized cooling medium is liquefied again with the fall of the temperature, and passes through the pipe 404b and is flowed out and collected to the cooling control unit 403.

Figure 5:
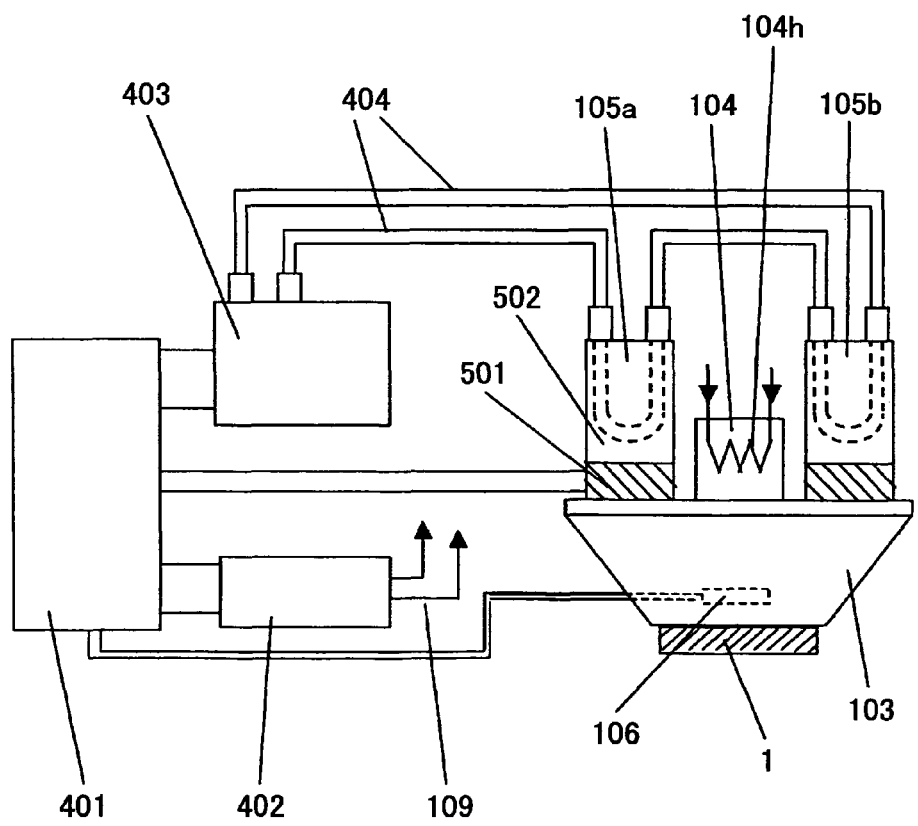
FIG. 5 is a diagram showing the composition of the temperature control system in the first embodiment of the temperature control device according to the invention.

Moreover, when the composition of FIG. 4A is constituted so that the cooling units 105a and 105b are made by using the Peltier device and the radiation part which absorbs the heat of the Peltier device, and the structure of contacting the cooling medium, such as water, to the radiation part is used, such composition is shown in FIG. 5.

As shown in FIG. 5, the Peltier device 501 is disposed, as the composition element of the cooling unit 105, on the second principal surface 102 of the heat conduction part 103, and the radiation part 502 is laminated on the Peltier device 501. The heat generated in the Peltier device 501 is absorbed by passing the cooling medium through the radiation part 502.

The control is facilitated by supplying the source power to the Peltier device 501 from the system control device 401. Other composition can be considered as being the same as the composition shown in FIG. 4A.

Figure 6A:
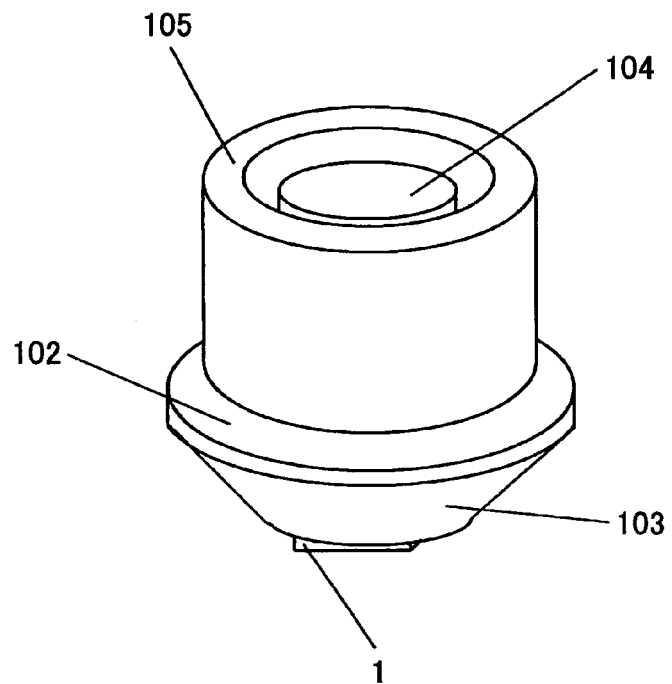
FIG. 6A is a side view showing the modification of the first embodiment of the temperature control device according to the invention.
Figure 6B:
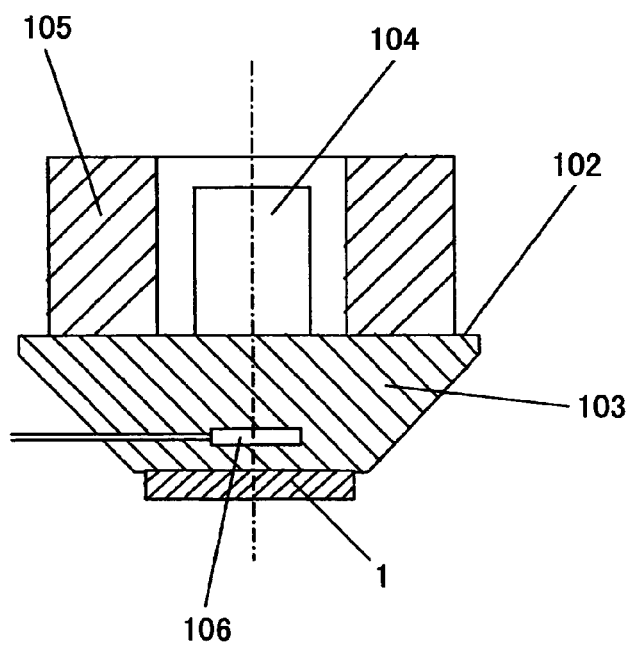
FIG. 6B is a cross-sectional view showing the modification of the first embodiment of the temperature control device according to the invention.

Apart from the parallel arrangement mentioned above, the arrangement of the heating head 104 and the cooling unit 105 may be configured by the structure in which the heating head 104 and the cooling unit 105 are disposed on the second principal surface 102 of the heat conduction part 103 such that the heating head 104 is arranged mostly in the central part and the annular cooling unit 105 is arranged to surround the circumference of the heating head 104 as shown in the modification of FIG. 6A and FIG. 6B.

Figure 6C:
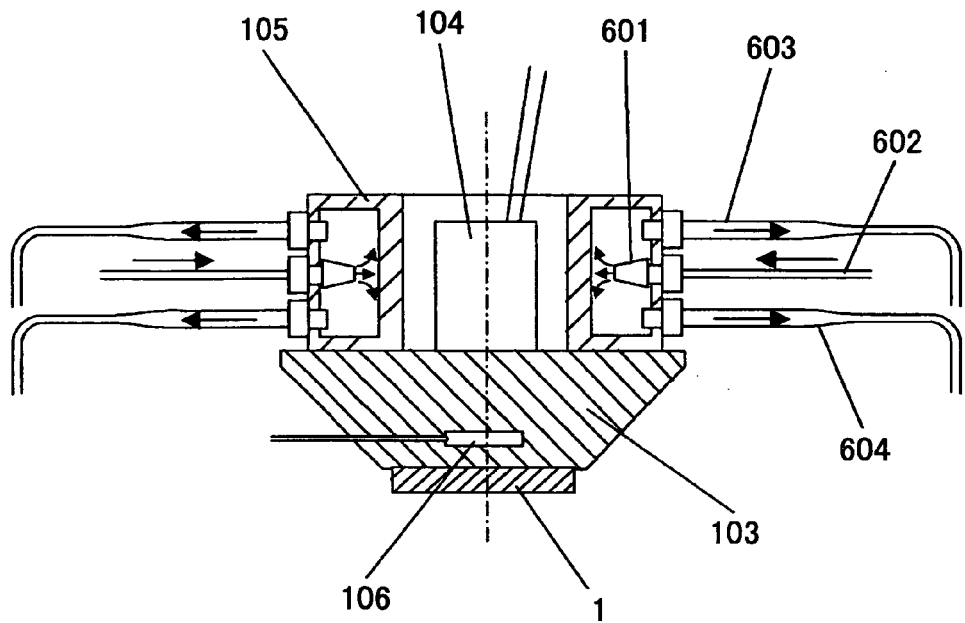
FIG. 6C is a cross-sectional side elevation showing the cooling method in the first embodiment of the temperature control device according to the invention.
Figure 6D:
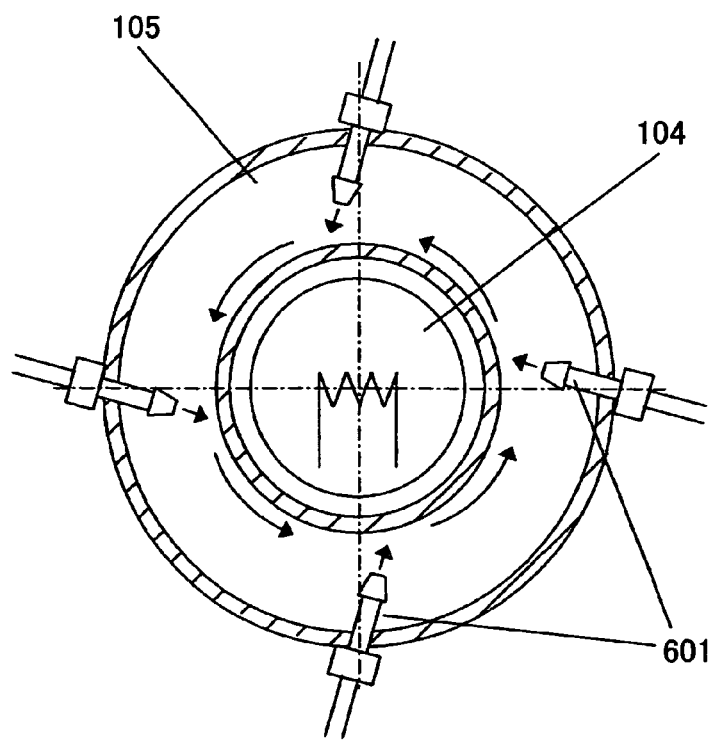
FIG. 6D is a cross-sectional view showing the cooling method in the first embodiment of the temperature control device according to the invention.

For example, in the annular cooling unit 105, as shown in FIG. 6C and FIG. 6D, the injection nozzle 601 which injects the cooling medium from the external wall portion to the internal wall portion is disposed, and the injection nozzle is inclined from the direction of the circumference of the annular cooling unit 105.

The cooling medium which is received through the pipe 602 is injected from the injection nozzle 601 to the internal wall 105w of the cooling unit 105. The cooling unit 105 is cooled by the evaporation heat when the cooling medium is evaporated. The vaporized cooling medium passes through the pipe 603, and is flowed out and collected to the cooling control unit. On the other hand, the cooling medium is again liquefied with the fall of the temperature, and it is flowed out and collected to the cooling control unit through the pipe 604.

FIG. 6D shows the cross-sectional composition of the injection nozzle 601 only.

Figure 7:
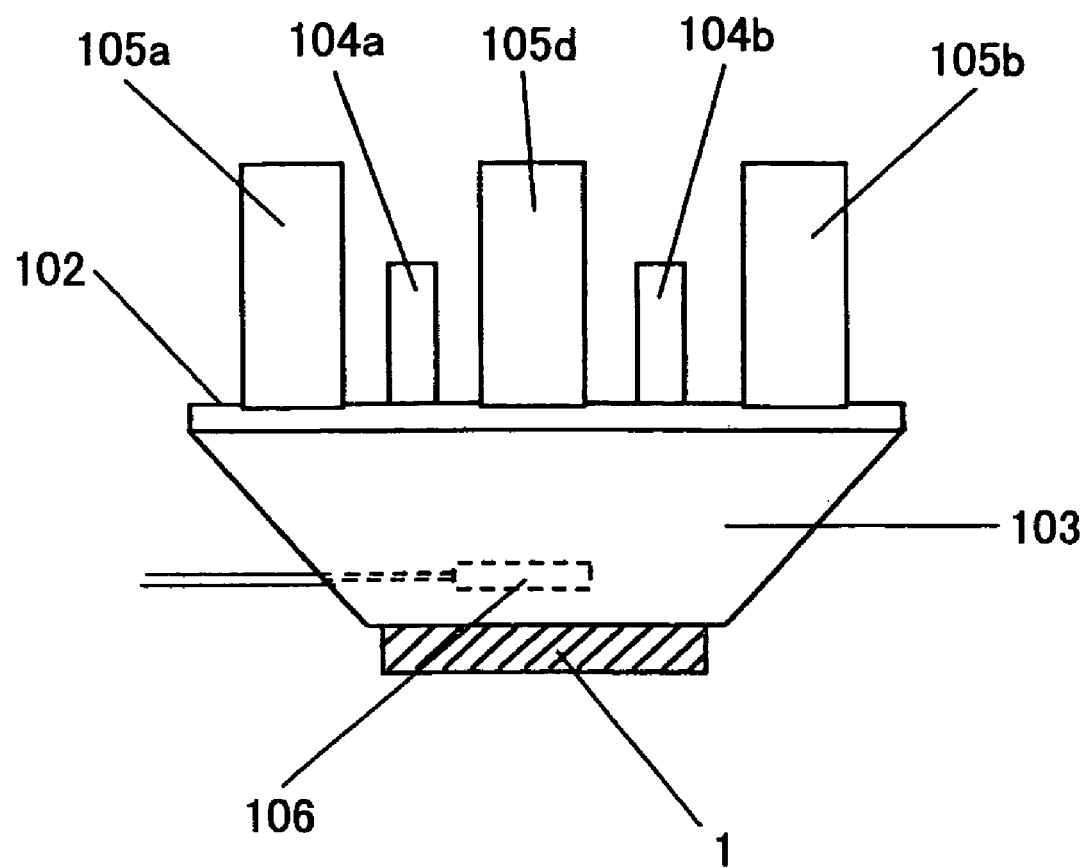
FIG. 7 is a side view showing the modification of the first embodiment of the temperature control device according to the invention.

Moreover, as in the modification shown in FIG. 7, the first cooling unit 105a may be disposed in the central part on the second principal surface 102 of the heat conduction part 103, the heating head 104 may be disposed on both the sides of the cooling unit 105c, and the cooling unit 105d may be disposed outside the heating head 104.

Each of the capability of heating and the capability of cooling can be increased by providing the plurality of heating heads and the plurality of cooling units, and the effect of agitation of the heat can also be increased.

In the above modification, the thermal energy larger than that corresponding to the electric power of the controlled part, such as the electronic part, is provided, and it is possible to follow and respond quickly to a change of the electric power of the controlled part.

Also, the above-mentioned modification may be configured so that the heating heads 104a and 104b are connected in the ring-like formation with the cooling unit 105d being the center, and the cooling units 104a and 104b are further connected in the ring-like formation, and the arrangement is made in the multiple ring-like formation.

Second Embodiment

The second embodiment of the temperature control device according to the invention will be explained using FIG. 8A and FIG. 8B.

Figure 8A:
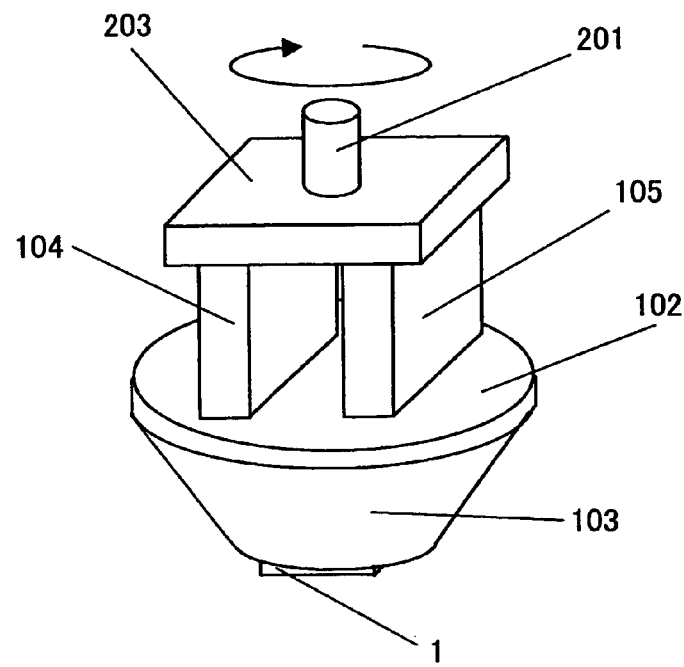
FIG. 8A is a perspective view showing the second embodiment of the temperature control device according to the invention.
Figure 8B:
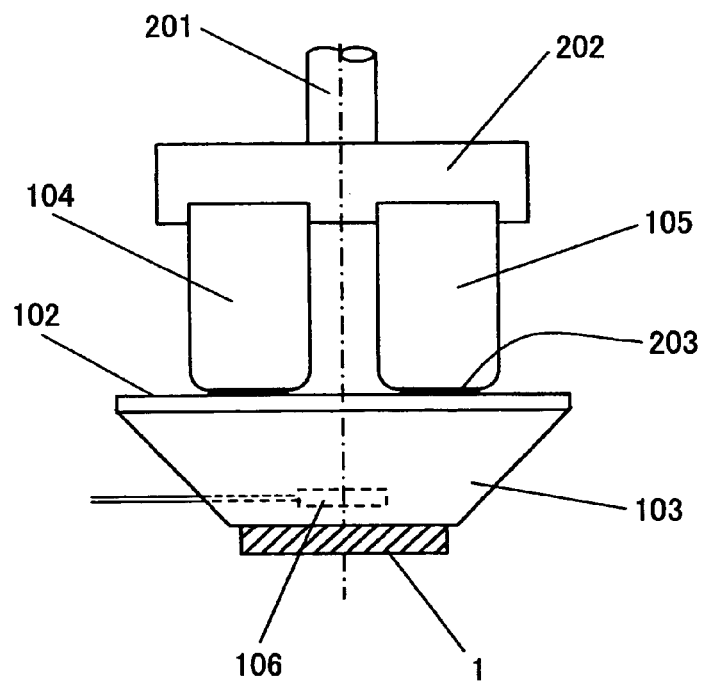
FIG. 8B is a side view showing the second embodiment of the temperature control device according to the invention.

In FIG. 8A and FIG. 8B, the elements which are the same as corresponding elements in the first embodiment are designated by the same reference numerals, and a description thereof will be omitted.

The temperature control device 200 in this embodiment is configured, as shown in FIG. 8A and FIG. 8B, so that the heating unit 104 and the cooling unit 105 are supported pivotably on the second principal surface 102 with the heat conduction part 103 which has the first principal surface 101 that can contact to the electronic part 1 which is the target of temperature control, such as a semiconductor device, and the second principal surface 102 opposite to the first principal surface 101 is provided.

In the above-mentioned composition, heat conduction part 103 is formed with thermally conductive high materials, such as copper (Cu) or aluminum (Al).

On the other hand, the first principal surface 101 of the heat conduction part 103 has the configuration and area corresponding to the electronic part 1, the second principal surface 102, the first principal surface 101 has the area, and considerable distance leaves the first principal surface 101 and second principal surface 102, and they are substantially made parallel.

And the side of the heat conduction part 103 makes the taper configuration extended at the end of the second principal surface 102 from the end of the first principal surface 101. Therefore, the heat conduction part 103 has a trapezoidal cross-section mostly.

The electronic part the first about 101 principal surface, i.e., for temperature control, are approached, and temperature sensor 106 is disposed in the inside of the heat conduction part 103 (embedded).

On the other hand, the heating unit 104 comprises an electric resistance heater. To a cooling block or a radiation fin, contact of cooling media, such as water, of cooling unit 705 is enabled including the radiation fin which touches a cooling block or a Peltier device.

The point whose rotational movement was made possible has the characteristic composition in this embodiment in the second principal surface 102 top, the heating unit 104 and the cooling unit 105 being held common to support portion 202 supported by the rotation shaft 201, and touching the second principal surface 102 of the heat conduction part 103.

The electric resistance heater 104, the lead wire drawn from a Peltier device, etc. are drawn via the inside of support portion 202 and the rotation shaft.

The rotational movement of the heating unit 104 and the cooling unit 105 is carried out at a given predetermined angle in succession with rotation of the rotation shaft 201. The thermal conductivity and the ductility of silicon system grease etc. make high lubricant 203 intervene filmy, and aim at reduction of mechanical contact resistance, and thermal unity is increased to the contact part of the second principal surface 102, and the heating unit 104 or the cooling unit 105.

When the temperature of the electronic part 1 rises by generation of heat in the electronic part 1, temperature sensor 106 detects this and cooling unit 105 is made to operate in temperature control device 200 which has the above-mentioned composition based on the detection result.

At this time, cooling unit 105 moves with heating head 104 in the second principal surface 102 top, and cools heat conduction part 103. As a result, the heat generated from the electronic part lets heat conduction part 103 pass, and is absorbed and radiated by cooling unit 105, and the temperature rise of the electronic part 1 is prevented.

At this time, like the first embodiment, between the electronic part 1 and cooling unit 105, heat conduction part 103 which is heat capacity and which becomes in size intervenes, and the heat conduction part 103 has a tapered cross-section.

From the cross-section, the distance more than the thickness (board thickness) of the heat conduction part 103 exists substantially between the electronic part 1 and cooling unit 105.

For this reason, the heat produced in the electronic part 1 is easily absorbed and radiated in heat conduction part 103. Therefore, a rapid temperature fall is not invited to electronic-parts 1 the very thing, but it is prevented that a thermal damage is given to the electronic part 1.

In addition, the thing for which the rotational movement of the heating unit 104 and the cooling unit 105 is made possible, the heating unit 104 and the cooling unit 105, there is not enlargement or the necessity of disposing more than one, about each.

Third Embodiment

The third embodiment of the temperature control device according to the invention will be explained using FIG. 9A and FIG. 9B.

Figure 9A:
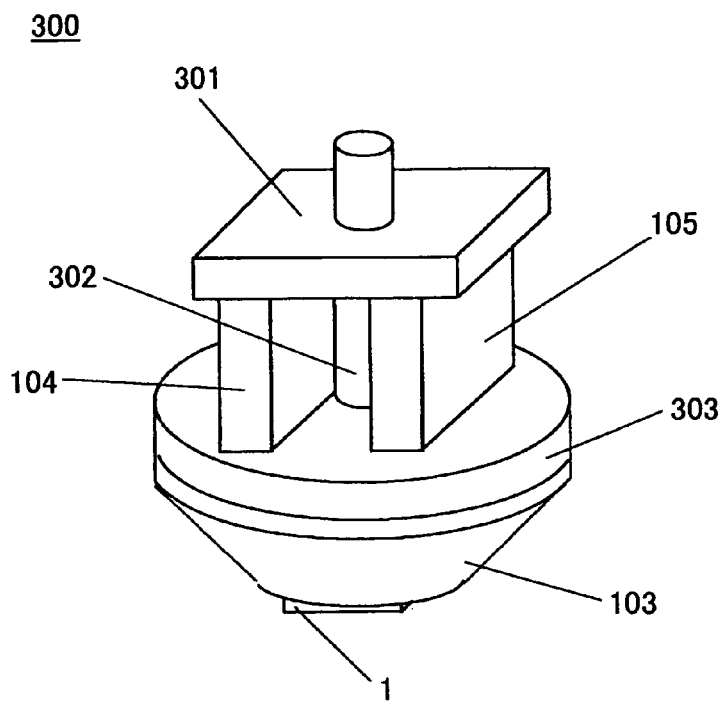
FIG. 9A is a perspective view showing the third embodiment of the temperature control device according to the invention.

In FIG. 9A and FIG. B, the elements which are the same as corresponding elements in the first and second embodiments are designated by the same reference numerals, and a description thereof will be omitted.

Figure 9B:
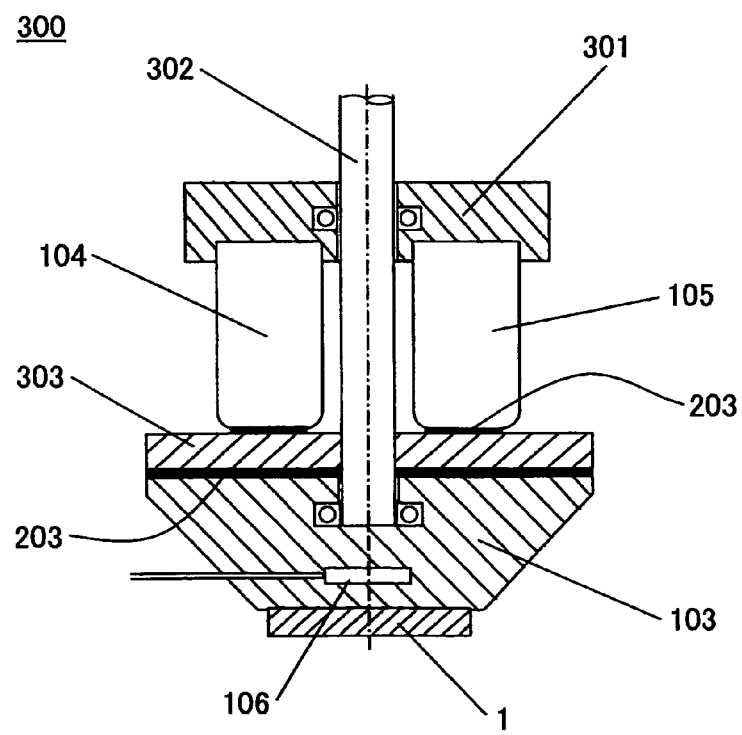
FIG. 9B is a cross-sectional view showing the third embodiment of the temperature control device according to the invention.

The temperature control device 300 in this actual condition mode as shown in FIG. 9A and FIG. 9B, the heat conduction part 103 which has the first principal surface 101 that can contact to the electronic part 1 which are the targets of temperature control, such as a semiconductor device, and the second principal surface 102 opposite to the first principal surface 101, the heating unit 104 supported by support portion 301 on the second principal surface 102, and the cooling unit 105 are provided.

It is supported by the rotation shaft 302, and disk 303 made pivotable in parallel with the second principal surface 102 of the heat conduction part 103 between heat conduction part 103, the heating unit 104, and the cooling unit 105 is arranged and constituted.

In the above-mentioned composition, the heat conduction part 103 is formed with thermally conductive high materials, such as copper (Cu) or aluminum (Al).

On the other hand, the first principal surface 101 of the heat conduction part 103 has the configuration and area corresponding to the electronic part 1, the second principal surface 102, the first principal surface 101 has the area, and considerable distance leaves the first principal surface 101 and second principal surface 102, and they are substantially made parallel.

And the side of the heat conduction part 103 makes the taper configuration extended at the end of the second principal surface 102 from the end of the first principal surface 101. Therefore, the heat conduction part 103 has a trapezoidal cross-section mostly.

The electronic part the first about 101 principal surface, i.e., for temperature control, are approached, and temperature sensor 106 is disposed in the inside of the heat conduction part 103 (embedded).

On the other hand, the heating unit 104 comprises an electric resistance heater. To a cooling block or a radiation fin, contact of cooling media, such as water, of cooling unit 105 is enabled including the radiation fin which touches a cooling block or a Peltier device.

It omits illustrating also about the lead wire drawn from electric resistance heater 104 and a Peltier device.

The disk 303 is formed with thermally conductive high materials, such as copper (Cu) or aluminum (Al), like heat conduction part 103, and let the size (diameter) be the second principal surface 102 of the heat conduction part 103, and a size more than equivalent.

The composition of this embodiment is characterized in that the disk 303 is supported and rotated by the rotation shaft 302. At this time, make lubricant 203 intervene between the second principal surface 102 and disk 303 and between disk 303, the heating unit 104, or a contact part with cooling unit 105, and reduction of mechanical contact resistance is aimed at, and thermal unity is increased.

By the arrangement of rotating disk 303, the heat conduction between the heating unit 104 and the cooling unit 105, and the second principal surface 102 of the heat conduction part 103 can be equalized more.

When the temperature of the electronic part 1 rises by generation of heat in the electronic part 1, temperature sensor 106 detects this and cooling unit 105 is made to operate in temperature control device 300 which has the above-mentioned composition based on the detection result.

The heat conduction part 103 is cooled at this time, disk 303 rotating. As a result, the heat generated from the electronic part lets heat conduction part 103 and disk 303 pass, and is absorbed and radiated by cooling unit 105, and the temperature rise of the electronic part 1 is prevented.

At this time, heat conduction part 103 which is heat capacity and as for which size becomes, and disk 303 found shines and carried out intervene between the electronic part 1 and cooling unit 105. For this reason, the heat produced in the electronic part 1 is easily absorbed and radiated in heat conduction part 103.

And the heat conduction part 103 has a tapered cross-section between the electronic part 1 and cooling unit 105, and the distance more than the thickness (board thickness) of the heat conduction part 103 exists substantially.

Since the disk 303 intervenes, it is eased further, and heat conduction does not invite a rapid temperature fall to electronic-parts 1 the very thing, but it is prevented that a thermal damage is given to the electronic part 1.

Figure 9C:
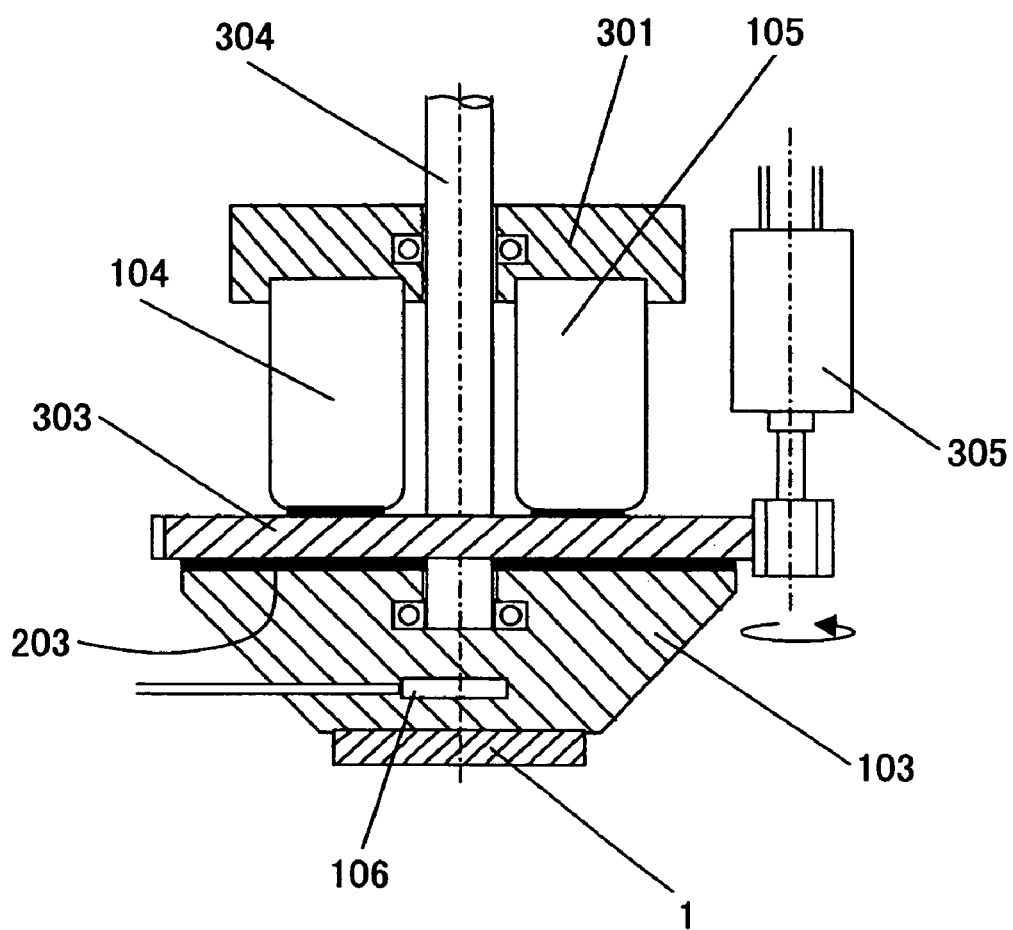
FIG. 9C is a cross-sectional view showing the modification of the third embodiment of the temperature control device according to the invention.

In the actual condition mode shown in FIG. 9A and FIG. 9B although supporting disk 303 by the rotation shaft 302 it is pivotable, as it is shown in FIG. 9C, it is fixed axle 3 about the rotation shaft 302.

It is good also as pivotable in disk 303 by changing into 04, disposing the slot which disposes a gear in the perimeter side of disk 303 supported by fixed axle 304 via the bearing or in which a belt is accommodated, and combining with motor 305 via a gear or a belt.

Fourth Embodiment

The fourth embodiment of the temperature control device according to the invention will be explained using FIG. 10. The same number is attached about the composition corresponding to the first through third embodiments.

Figure 10A:
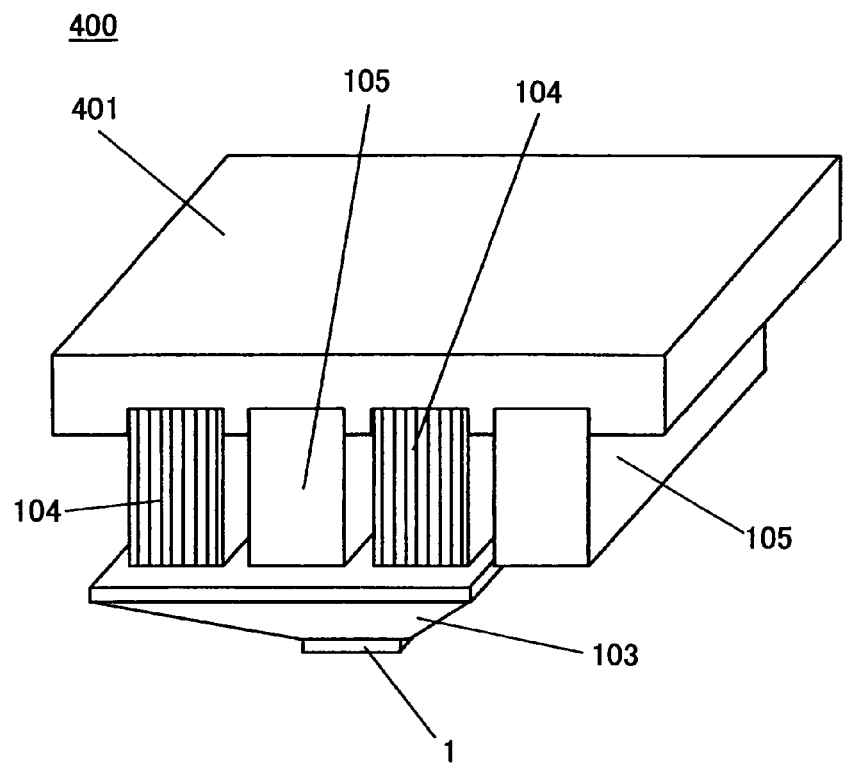
FIG. 10A is a perspective view showing the fourth embodiment of the temperature control device according to the invention.
Figure 10B:
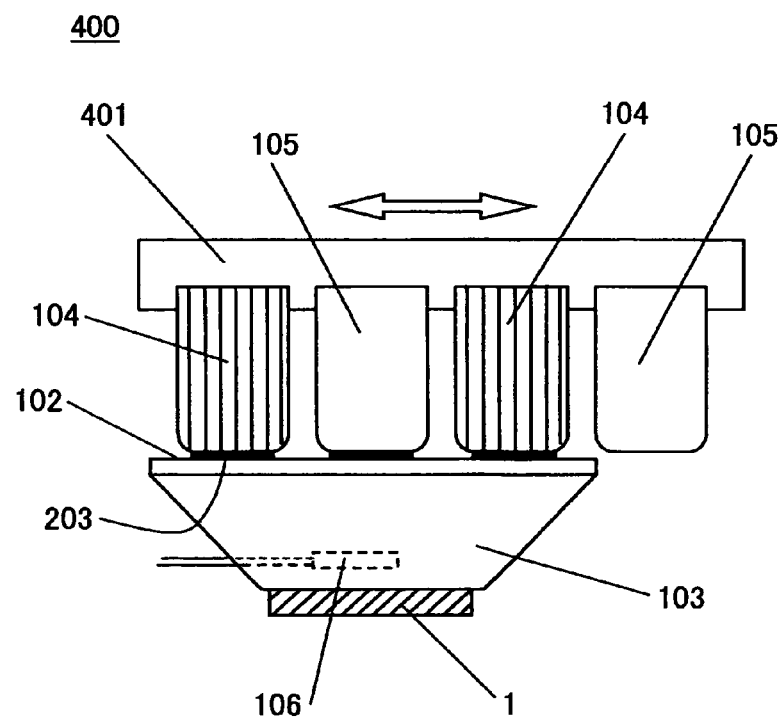
FIG. 10B is a side view showing the situation of operation in the fourth embodiment of the temperature control device according to the invention.
Figure 10C:
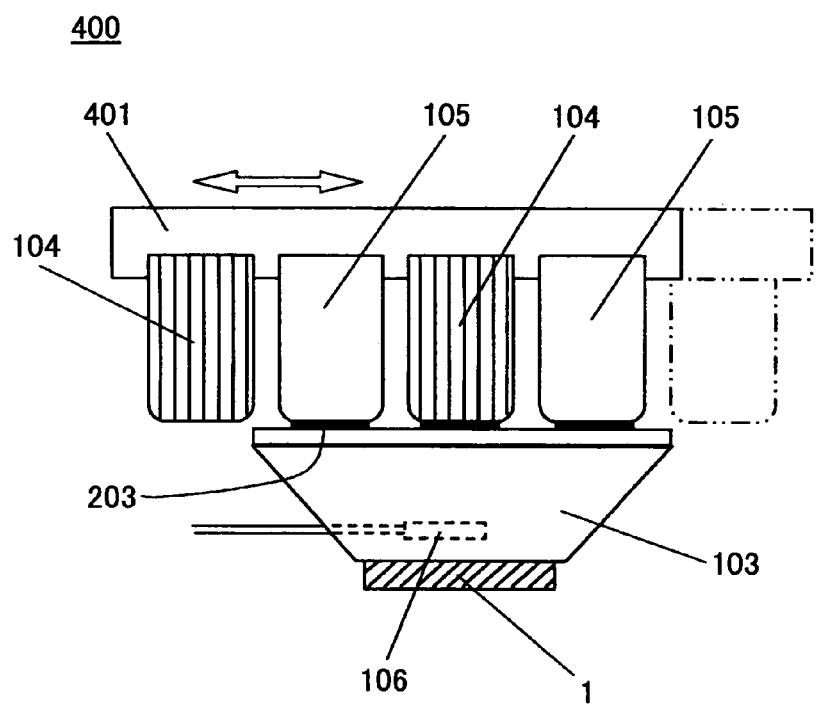
FIG. 10C is a side view showing the situation of operation in the fourth embodiment of the temperature control device according to the invention.

The temperature control device 400 in this actual condition mode as shown in FIGS. 10A, 10B, and 10C, in the heat conduction part which has the first principal surface 101 that can contact to the electronic part 1 which are the targets of temperature control, such as a semiconductor device, and the second principal surface 102 corresponding to the first principal surface 101, and second principal surface 102 top. The heat conduction member 104 and cooling unit 105 which were held at sliding member 401 which can be slid in the direction parallel to the second principal surface are provided.

In the above-mentioned composition, heat conduction part 103 is formed with thermally conductive high materials, such as copper (Cu).

On the other hand, the first principal surface 101 of the heat conduction part 103 has the configuration and area corresponding to the electronic part 1, the second principal surface 102, the first principal surface 101 has the area, and considerable distance leaves the first principal surface 101 and second principal surface 102, and they are substantially made parallel.

And the side of the heat conduction part 103 makes the taper configuration extended at the end of the second principal surface 102 from the end of the first principal surface 101. Therefore, the heat conduction part 103 has a trapezoidal cross-section mostly.

The electronic part the first about 101 principal surface, i.e., for temperature control, are approached, and temperature sensor 106 is disposed in the inside of the heat conduction part 103 (embedded).

On the other hand, the heating unit 104 comprises an electric resistance heater. To a cooling block or a radiation fin, contact of cooling media, such as water, of cooling unit 105 is enabled including the radiation fin which touches a cooling block or a Peltier device.

It omits illustrating also about the lead wire drawn from electric resistance heater 104 and a Peltier device.

While the heating unit 104 and the cooling unit 105 are held common to the sliding member 401 and the characteristic composition in this embodiment touches the second principal surface 102 of the heat conduction part 103, the second principal surface 102, it is in the point made movable.

The sliding member 401 is made of an insulating resin having a heat resistance, such as a glass epoxy or a polyimide, and the heating unit 104 and the cooling unit 105 are disposed in the principal surface of one of these along with the two-piece heating units 104a and 104b, the cooling units 105a and 105b, respectively.

The sliding member 401 is provided so that the heating unit 104 and the cooling unit 105 are movable in the two directions for every predetermined distance in succession in connection with this.

Between the contact parts of the second principal surface 102 of the heat conduction part 103, and the heating unit 104 or the cooling unit 105, make lubricant 203 intervene, and reduction of mechanical contact resistance is aimed at, and thermal unity is increased.

It is supposed that the heating unit 104 and the cooling unit 105 are movable, there is no necessity of enlarging each of the heating unit 104 and the cooling unit 105.

When the temperature of the electronic part 1 rises by generation of heat in the electronic part 1, temperature sensor 106 detects this and cooling unit 105 is made to operate in temperature control device 400 which has the above-mentioned composition based on the detection result.

At this time, with heating head 104, cooling unit 105 moves in heat conduction part 103 top, and cools heat conduction part 103.

As a result, the heat generated from the electronic part lets heat conduction part 103 pass, and is absorbed and radiated by cooling unit 105, and the temperature rise of the electronic part 1 is prevented.

At this time, heat conduction part 103 which is heat capacity and which becomes in size intervenes between the electronic part 1 and cooling unit 105.

For this reason, the heat produced in the electronic part 1 is easily absorbed and radiated in heat conduction part 103.

And the heat conduction part 103 has a tapered cross-section between the electronic part 1 and cooling unit 105, and the distance more than the thickness (board thickness) of the heat conduction part 103 exists substantially.

Therefore, a rapid temperature fall is not invited to electronic-parts 1 the very thing, but it is prevented that a thermal damage is given to the electronic part 1.

Fifth Embodiment

The fifth embodiment of the temperature control device according to the invention will be explained using FIG. 11.

Figure 11:
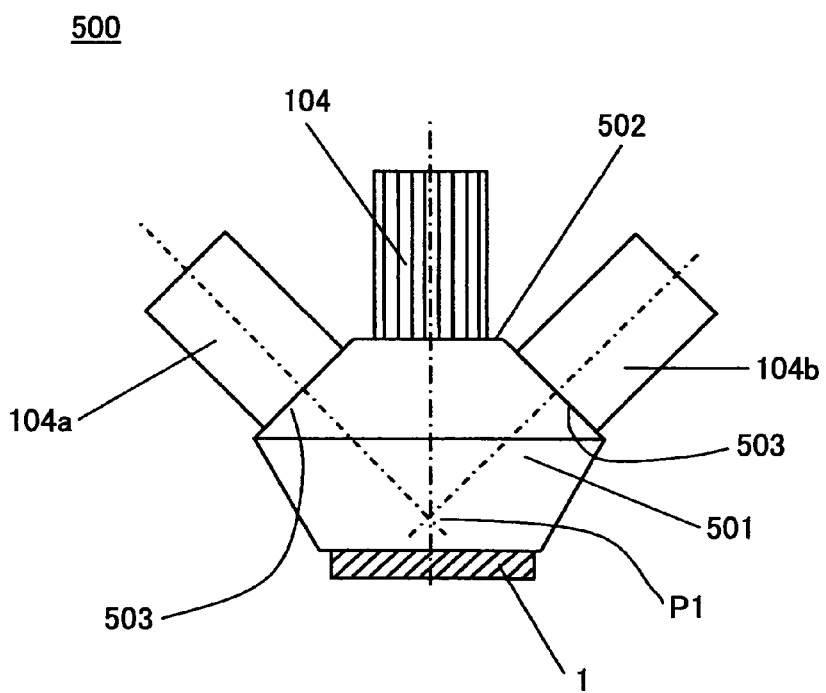
FIG. 11 is a side view showing the fifth embodiment of the temperature control device according to the invention.

In FIG. 11, the elements which are the same as corresponding elements in the first through fourth embodiments are designated by the same reference numerals, and a description thereof will be omitted.

In the temperature control device as shown in FIG. 11, this actual condition mode 500, the heat conduction part 501 which has the first principal surface 101 that can contact to the electronic part 1 which are the targets of temperature control, such as a semiconductor device, and the second principal surface 102 opposite to the first principal surface 101 and the heating unit 104 disposed on the second principal surface 501, and the cooling unit 105 are provided.

In the above-mentioned composition, the heat conduction part 103 is formed with thermally conductive high materials, such as copper (Cu) or aluminum (Al).

In the temperature control device 500 of this embodiment, although the first principal surface 101 has the configuration and area corresponding to the electronic part 1, not the uniform plane like an embodiment but the trapezoidal cross-section is formed for the second principal surface 102 side of the heat conduction part 501.

The heat conduction member 104 is disposed in trapezoid upper surface (top part) 502, and cooling units 105a and 105b are disposed in slope 503.

The cooling unit 105 is disposed in the slope 503 of the second principal surface, the intersection part of each central line containing the heating unit 104 is set as predetermined domain P1 which carried out distance estrangement from the electronic part 1 which touch the first principal surface 101 of the heat conduction part 501.

On the other hand, the side of the heat conduction part 501 makes the taper configuration extended at the end of the second principal surface 102 from the end of the first principal surface 101. The temperature sensor disposed in heat conduction part 501 (embedded) is located and disposed between the first about 101 principal surface and intersection part P1.

When the temperature of the electronic part 1 rises by generation of heat in the electronic part 1, a temperature sensor detects this and cooling unit 105 is made to operate in temperature control device 500 which has the above-mentioned composition based on the detection result.

At this time, heat conduction part 501 which is heat capacity and which becomes in size intervenes between the electronic part 1 and cooling unit 105.

For this reason, the heat produced in the electronic part 1 is easily absorbed and radiated in heat conduction part 501, and the heat conduction part 501 since it has the tapered cross-section in the principal surface, between the electronic part 1 and cooling unit 105, the distance more than the thickness (board thickness) of the heat conduction part 103 exists substantially. Therefore, the heat generated from the electronic part 1 lets heat conduction part 103 pass, and is absorbed and radiated by cooling unit 105, and the temperature rise of the electronic part 1 is prevented.

In addition, the cooling unit 105 and the intersection part P1 of each central line of the heating unit 104 are set as the predetermined portion which carried out distance estrangement from the electronic part 1 which touch the first principal surface 101 of the heat conduction part 501, or concentration of the heat of the operating period is prevented at the time of heating to the electronic part 1.

For this reason, a rapid temperature fall or a rapid temperature rise is not invited to the electronic part 1 by itself, and it is possible to prevent giving of the thermal damage to the electronic part 1.

Sixth Embodiment

The sixth embodiment of the temperature control device according to the invention will be explained using FIG. 12A and FIG. 12B.

Figure 12A:
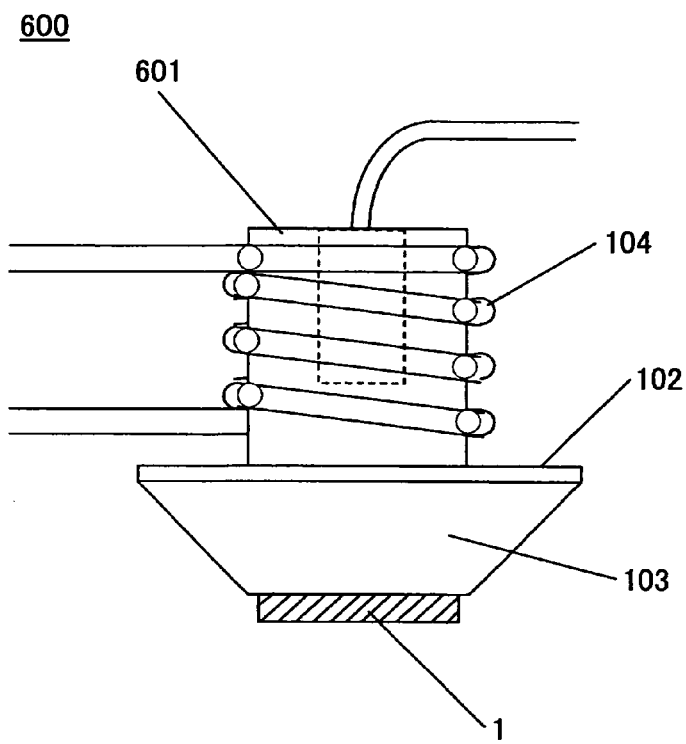
FIG. 12A is a side view showing the sixth embodiment of the temperature control device according to the invention.
Figure 12B:
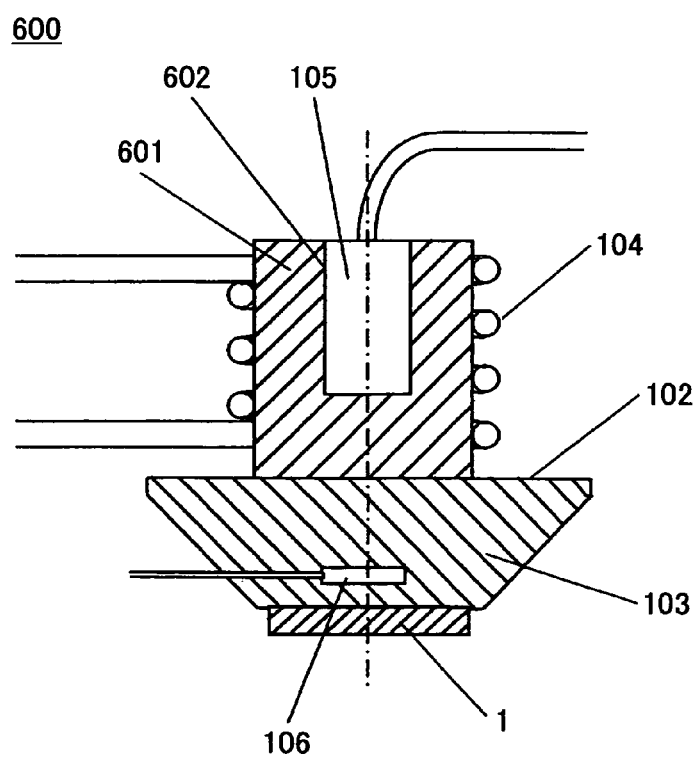
FIG. 12B is a cross-sectional view showing the sixth embodiment of the temperature control device according to the invention.

In FIG. 12A and FIG. 12B, the elements which are the same as corresponding elements in the first through fifth embodiments are designated by the same reference numerals and a description thereof will be omitted.

In the temperature control device 600 of this embodiment of FIG. 12A and FIG. 12B, the heat conduction part 103, the heating unit 104 and the cooling unit 105 are provided. The heat conduction part 103 has the first principal surface 101 which contacts the electronic part 1 which is the object of temperature control, such as a semiconductor device, and the second principal surface 102 opposite to the first principal surface 101. The heating unit 104 and the cooling unit 105 are disposed on the second principal surface 102 and formed integrally with the heat conduction pillar 601 and coaxially with the heat conduction pillar 601.

In the above-mentioned composition, the heat conduction part 103 is made of a thermally conductive material, such as copper (Cu) or aluminum (Al).

The first principal surface 101 has the configuration and area corresponding to the configuration and area of the electronic part 1, and the second principal surface 102 has the area larger than the area of the first principal surface 101. And the first principal surface 101 and the second principal surface 102 are separated from each other by a certain distance, and they are substantially in parallel with each other.

And the side of the heat conduction part 103 has a tapered shape extending from the end of the first principal surface 101 to the end of the second principal surface 102. Therefore, the heat conduction part 103 has a trapezoidal cross-section mostly.

In addition, the temperature sensor 106 is disposed in the inside of the heat conduction part 103 (embedded) near the first principal surface 101 (or in the vicinity of the electronic part or the object of temperature control).

The heating unit 104 is disposed on the second principal surface 102 of the heat conduction part 103 in the peripheral part of the heat conduction pillar 601 made of copper (Cu) or aluminum (Al). The cooling unit 105 is disposed in the concave portion 602 which is provided at the other end (upper end) central part of the heat conduction pillar 601. The heat conduction member 104 comprises an electric resistance heater similar to the previous embodiment.

The cooling unit 105 comprises a cooling block or a Peltier device with the radiation fins in contact with the Peltier device, and the cooling medium, such as water, can be contacted to the radiation fins.

Thus, the miniaturization can be attained by arranging the heating unit 104 and the cooling unit 105 in the co-axial formation using the plate-like member made of the thermally conductive material.

In the temperature control device 600 having the above-mentioned composition, when the temperature of the electronic part 1 rises by the heat generated in the electronic part 1, the temperature sensor 106 detects the temperature rise and the cooling unit 105A is controlled to operate based on the detection result.

At this time, the cooling unit 105A cools the heat conduction part 103 through the heat conduction pillar 601. As a result, the heat generated from the electronic part 1 passes through the heat conduction part 103, and it is absorbed and radiated by the cooling unit 105, and the temperature rise of the electronic part 1 is prevented.

At this time, the heat conduction part 103 which has a large heat capacity is interposed between the electronic part 1 and the cooling unit 105. For this reason, the heat produced in the electronic part 1 is easily absorbed and radiated by the heat conduction part 103. And the heat conduction part 103 has a tapered cross-section between the electronic part 1 and the cooling unit 105, and the distance which is substantially larger than the thickness of the heat conduction part 103 exists.

Therefore, a rapid temperature fall is not invited to the electronic part 1, and it is possible to prevent giving of the thermal damage to the electronic part 1.

The arrangement of the heating unit 104 and the cooling unit 105 mentioned above may be reversed.

Figure 12C:
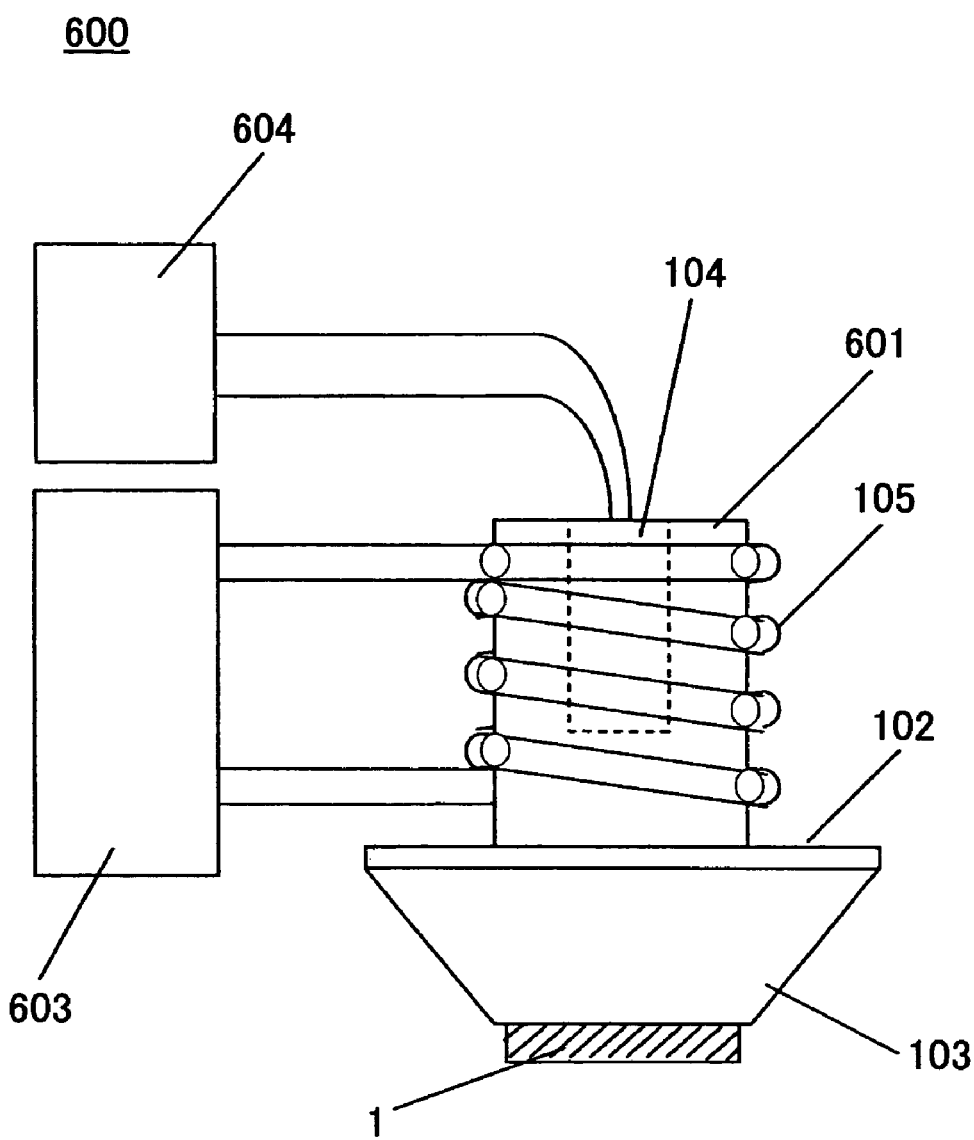
FIG. 12C is a side view showing the modification of the sixth embodiment of the temperature control device according to the invention.

As shown in FIG. 12C, the cooling unit 105 is disposed in the peripheral part of the heat conduction pillar 601, and the heating unit 104 is disposed in the concave portion 602 which is provided in the other end (upper end) central part of the heat conduction pillar 601.

The heating unit 104 comprises an electric resistance heater similar to the previous embodiment. The cooling unit 105 is constituted so that the circulation of the cooling medium, such as water, is performed in the inside of the pipe 603 which is wound on the perimeter of the heat conduction pillar 601.

Thus, the miniaturization can be attained by arranging the heating unit 104 and the cooling unit 105 in the coaxial formation using the plate-like member made of the thermally conductive material.

In the above-mentioned embodiment, the heat conduction part 103 has the side between the first principal surface 101 and the second principal surface 102 which is configured to have a straight line tapered shape. However, the configuration of the heat conduction part 103 side is not restricted to this embodiment.

Figure 13A:
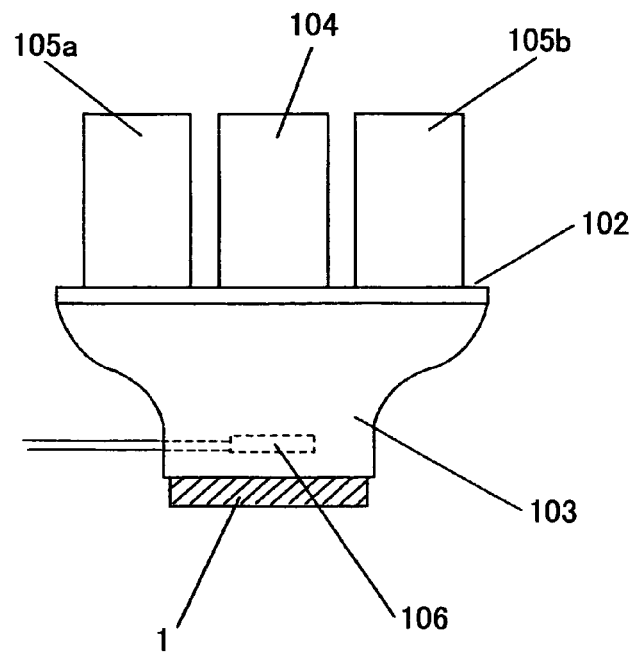
FIG. 13A is a side view showing the modification of the heat conduction part in the temperature control device according to the invention.
Figure 13B:
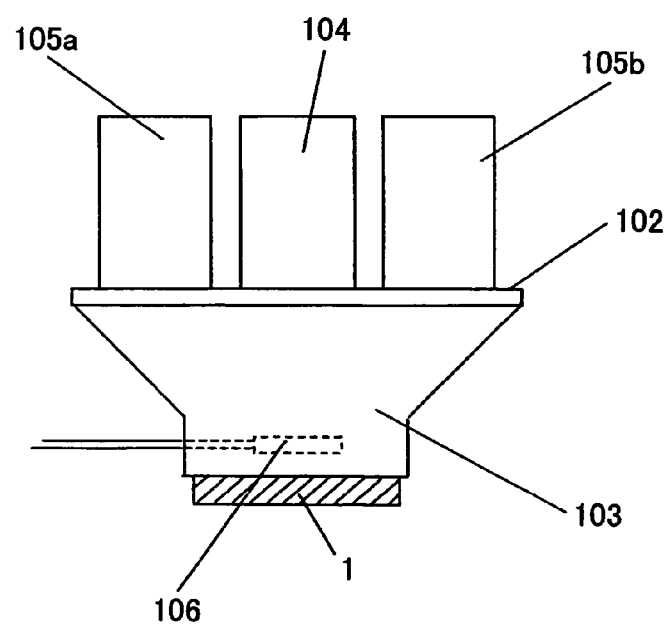
FIG. 13B is a side view showing the modification of the heat conduction part in the temperature control device according to the invention.

Namely, as shown in FIG. 13A or FIG. 13B, the end portion of the first principal surface 101 may extend almost perpendicularly to the first principal surface 101, and may extend from near the central part of the thickness direction of the heat conduction part 103 in the shape of a straight line circularly to the end of the second principal surface 102.

According to the above-mentioned configuration, in the central part of the thickness direction of the heat conduction part 103, a temperature rising action and a cooling action can be made intensively, and the temperature control to the electronic part 1 can be performed efficiently.

Seventh Embodiment

In the previously mentioned embodiments, the temperature control method for a semiconductor chip or a semiconductor chip contained in the package has been explained. However, the present invention is not limited to such a temperature control for the semiconductor chip. The temperature control of the present invention is also applicable to a semiconductor substrate (wafer) in which two or more semiconductor chips are formed. Namely, the temperature control of the present invention can be used also when conducting the evaluation and testing of the electrical properties of a corresponding semiconductor chip in the semiconductor substrate.

Figure 14A:
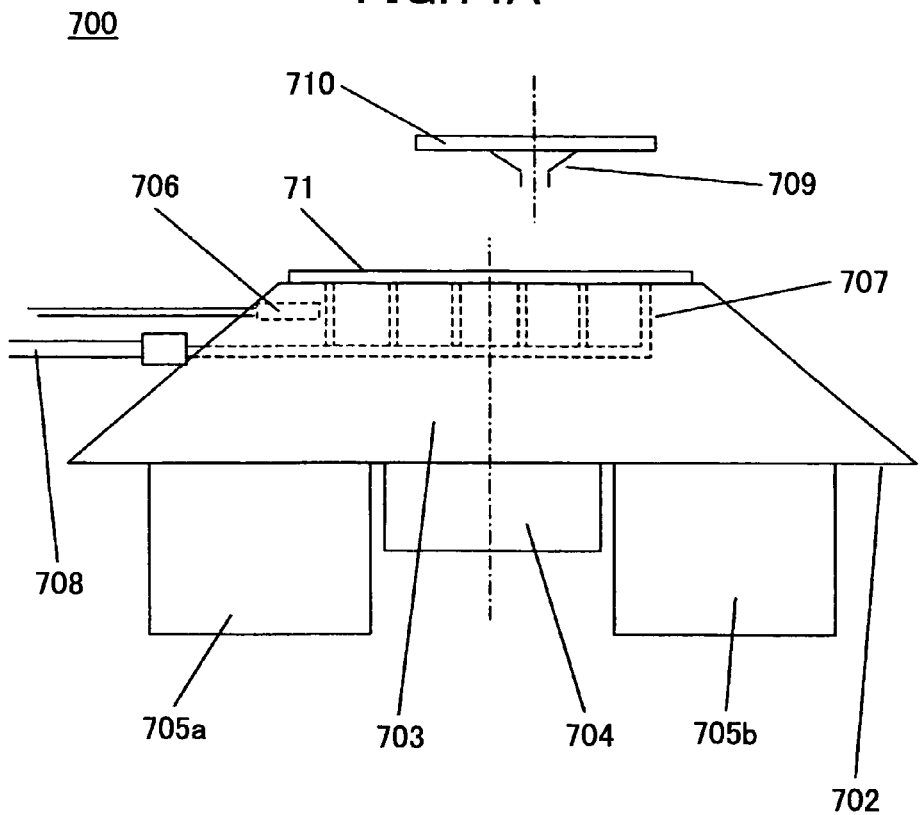
FIG. 14A is a side view showing the seventh embodiment of the temperature control device according to the invention.
Figure 14B:
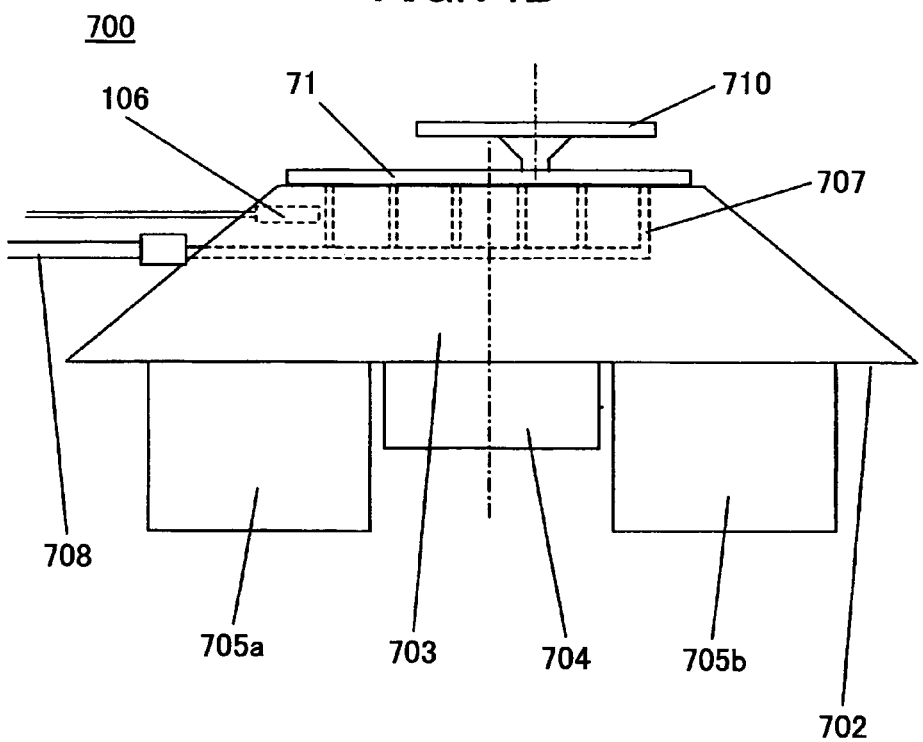
FIG. 14B is a side view showing the seventh embodiment of the temperature control device according to the invention.

As shown in FIG. 14A and FIG. 14B, the temperature control device 700 of this embodiment comprises: the heat conduction part 703 having the first principal surface 701 on which semiconductor substrate 71 is disposed, and the second principal surface 702 opposite to the first principal surface 701; the heating unit 704 which contacts the undersurface of the second principal surface 702 and is disposed in the central part mostly; and the cooling units 705a and 705b which contact the undersurface of the second principal surface 702 and are disposed on both the sides of the heating unit 704 so that the heating unit 704 and the cooling units 705a and 705b are arranged side by side.

In the above-mentioned composition, the semiconductor substrate 71 is disposed on the first principal surface 701 of the heat conduction part 703. On the upper-side principal surface of the semiconductor substrate 71, the plurality of semiconductor chips are disposed.

The heat conduction part 703 is made of a thermally conductive material, such as copper (Cu) or aluminum (Al), similar to the previous embodiment.

The first principal surface 701 of the heat conduction part 703 has the configuration and area corresponding to the configuration and area of the semiconductor substrate 71, the second principal surface 702 has the area larger than the area of the first principal surface 701, and the first principal surface 701 and the second principal surface 702 are separated from each other by a certain distance, and they are arranged substantially in parallel with each other.

And the side of the heat conduction part 703 is configured to have a tapered shape extending in a straight line manner from the end of the first principal surface 701 to the end of the second principal surface 702. Thus, the heat conduction part 703 has a trapezoidal cross-section mostly.

In the heat conduction part 703, the configuration and area of the first principal surface 701 correspond to the configuration and area of the semiconductor substrate of concern, The first principal surface 701 has the circular configuration the diameter of which is in the range of 200 mm to 300 mm. The second principal surface 702 has the circular configuration the diameter of which is in the range of 400 mm to 600 mm. And the thickness of the heat conduction part 703 is about 100 mm.

And the temperature sensor 706 is disposed in the inside of the heat conduction part 703 (embedded) near the first principal surface 701 (or in the vicinity of the semiconductor substrate 71 as the object of temperature).

For the sake of convenience of illustration, the temperature sensor 706 is located near the left end of the semiconductor substrate in FIG. 14A and FIG. 14B. However, the temperature sensor 706 is actually located and disposed in the center of the semiconductor substrate 71 mostly.

Moreover, there are disposed on the principal surface 701 of the heat conduction part 703, the plurality of absorbing holes 707 and the pipe 708 for connecting the adsorbing holes 707 to the vacuum exhaust device (not shown), and the absorbing holes 707 and the pipe 708 are provided for adsorbing and holding of the semiconductor substrate 71 to be processed.

On the other hand, the heating unit 704 comprises an electric resistance heater. And the cooling unit 705 comprises a cooling block or a Peltier device with the radiation fins in contact with the Peltier device, and the cooling medium, such as water, is contacted to the cooling block or the radiation fins.

The illustration of the lead wires drawn from the electric resistance heater 704 and the Peltier device and the paths of circulation of the cooling medium will be omitted.

In the above-mentioned composition, the probe card 710 in which the plurality of terminals 709 are provided is arranged on the semiconductor substrate 71 so that the probe card 710 confronts the semiconductor substrate 71.

When conducting the evaluation and testing of the corresponding semiconductor chip of the semiconductor substrate 71 of concern, the heat conduction part 703 is raised, and the electrodes of the semiconductor chip for evaluation/testing are contacted to the terminals 709 of the semiconductor substrate 71 held on the principal surface 701 of the heat conduction part 703, as shown in FIG. 14B.

And when conducting the evaluation and testing of another semiconductor chip, the heat conduction part 703 is temporarily lowered, the heat conduction part 703 is displaced in the horizontal direction so that the semiconductor chip of concern is located directly under the terminals 709. Then the heat conduction part 703 is raised again, and the electrodes of that semiconductor chip are contacted to the terminals 709.

The heat conduction part 703 is supported by a support arm in the peripheral edges of the second principal surface 702 so that the heat conduction part 703 is movable up and down, and the support arm is further supported by the X-Y stage so that the heat conduction part 703 is movable in the up-and-down directions and the right-and-left horizontal directions. However, the illustration of the above-mentioned mechanical composition for the heat conduction part 703 will be omitted.

According to the temperature control method of the invention, the temperature control of the semiconductor substrate 71 in which the plurality of semiconductor chips being evaluated and tested are disposed can be performed easily, and the evaluation and testing of the semiconductor device of concern can be carried out efficiently with high precision.

The present invention is not limited to the above-described embodiments, and variations and modifications may be made without departing from the scope of the present invention.

What is claimed is:

1. A temperature control method comprising:
   providing a heat conduction part having a first surface and a second surface opposite to the first surface, the first surface having a configuration corresponding to a configuration of a controlled part, the second surface being larger in surface area than the first surface, and side surfaces of the heat conduction part between the first surface and the second surface having a tapered shape;
   arranging the controlled part to contact the first surface of the heat conduction part; and
   driving at least one of a heating unit and a cooling unit to set the controlled part at a first temperature, the heating unit and the cooling unit being disposed on the second surface of the heat conduction part so that the heating unit and the cooling unit are arranged side by side.

2. The temperature control method according to claim 1 wherein the controlled part is an electronic part.

3. The temperature control method according to claim 2 wherein the electronic part is a semiconductor chip.

4. The temperature control method according to claim 1 wherein the controlled part is a semiconductor substrate.

* * * * *